(12) United States Patent
More et al.

(10) Patent No.: US 11,777,014 B2
(45) Date of Patent: Oct. 3, 2023

(54) CONTROLLED DOPING IN A GATE DIELECTRIC LAYER

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/140,453

(22) Filed: Jan. 4, 2021

(65) Prior Publication Data

US 2022/0216327 A1 Jul. 7, 2022

(51) Int. Cl.
*H01L 29/66* (2006.01)
*H01L 29/51* (2006.01)
*H01L 21/3115* (2006.01)
*H01L 29/78* (2006.01)
*H01L 21/8234* (2006.01)
*H01L 21/8238* (2006.01)
*H01L 29/423* (2006.01)

(52) U.S. Cl.
CPC .... *H01L 29/66795* (2013.01); *H01L 21/3115* (2013.01); *H01L 21/823462* (2013.01); *H01L 21/823857* (2013.01); *H01L 29/42364* (2013.01); *H01L 29/517* (2013.01); *H01L 29/785* (2013.01); *H01L 29/42392* (2013.01)

(58) Field of Classification Search
CPC ............. H01L 29/66795; H01L 29/785; H01L 29/517; H01L 27/0886; H01L 21/823431; H01L 21/3115
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |

(Continued)

*Primary Examiner* — Tuan A Hoang
(74) *Attorney, Agent, or Firm* — Sterne, Kessler, Goldstein & Fox P.L.L.C.

(57) ABSTRACT

The present disclosure describes method to form a semiconductor device having a gate dielectric layer with controlled doping. The method includes forming a gate dielectric layer on a fin structure, forming a diffusion barrier layer on the gate dielectric layer, and forming a dopant source layer on the diffusion barrier layer. The gate dielectric layer includes an interfacial layer on the fin structure and a high-k dielectric layer on the interfacial layer. A dopant of the dopant source layer diffuses into the gate dielectric layer. The method further includes doping a portion of the interfacial layer with the dopant and removing the dopant source layer. The portion of the interfacial layer is adjacent to the high-k dielectric layer.

20 Claims, 17 Drawing Sheets

(56) References Cited

U.S. PATENT DOCUMENTS

| | | | |
|---|---|---|---|
| 10,163,657 B1* | 12/2018 | Wang | H01L 21/02321 |
| 2004/0082130 A1* | 4/2004 | Suzuki | H01L 21/28194 |
| | | | 438/275 |
| 2015/0035073 A1* | 2/2015 | Ando | H01L 27/092 |
| | | | 438/783 |
| 2017/0179252 A1* | 6/2017 | Tang | H01L 29/66446 |
| 2019/0139759 A1* | 5/2019 | Cheng | H01L 21/28185 |
| 2020/0266068 A1* | 8/2020 | Li | H01L 21/823418 |
| 2020/0373404 A1* | 11/2020 | Lin | H01L 29/4958 |

* cited by examiner

CONTROLLED DOPING IN A GATE DIELECTRIC LAYER

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has introduced challenges to improve the performance of semiconductor devices.

BRIEF DESCRIPTION OF THE DRAWINGS

Aspects of the present disclosure are best understood from the following detailed description when read with the accompanying figures.

FIGS. 3A-12B illustrate various cross-sectional views of a semiconductor device having a gate dielectric layer with controlled doping at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
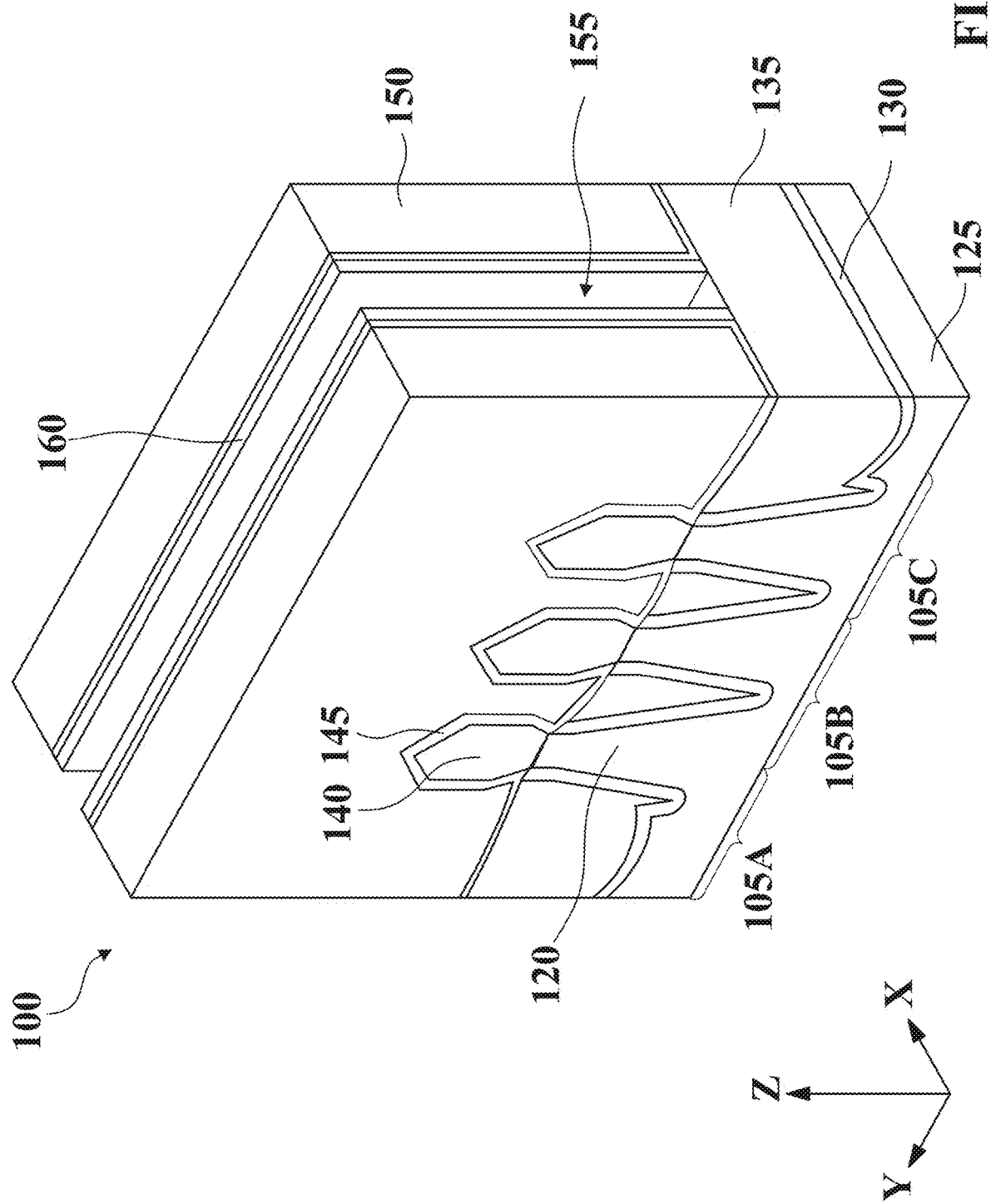
FIGS. 1A, 1B, and 1C illustrate isometric views and a cross-sectional view of a partially-fabricated semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5%-15% of the value (e.g., ±1%, ±2%, ±3%, ±4%, ±5%, ±10%, ±15% of the value). These values are merely examples and are not intended to be limiting. The terms "about" and "substantially" can refer to a percentage of the values as interpreted by those skilled in relevant art(s) in light of the teachings herein.

With increasing demand for lower power consumption, higher performance, and smaller semiconductor devices, dimensions of semiconductor devices continue to scale down. Field effect transistors (FETs) with multiple threshold voltages ($V_t$) can be manufactured for various applications. For example, FETs with a low $V_t$ (e.g., between about 50 mV and about 160 mV) can be used for "low" or "ultra-low" power applications within a chip, and FETs with high $V_t$ (e.g., greater than about 200 mV) can be used for high power applications within the chip. In addition, n-type FETs (also referred to as "NFETs") and p-type FETs (also referred to as "PFETs") can be manufactured with different $V_t$ suitable for each type of FET. The term "p-type" can be associated with a structure, layer, and/or region doped with p-type dopants, such as boron. The term "n-type" can be associated with a structure, layer, and/or region doped with n-type dopants, such as phosphorus. Dipole engineering can be used to modulate the effective work function of metal gates and form multiple threshold voltages for the semiconductor devices. Dipoles can be formed by diffusing dopants from a dopant source layer on a gate dielectric layer to a high-k dielectric layer of the gate dielectric layer. The term "high-k" can refer to a high dielectric constant. In the field of semiconductor device structures and manufacturing processes, high-k can refer to a dielectric constant that is greater than the dielectric constant of $SiO_2$ (e.g., greater than about 3.9).

With the continuous scaling down of device dimensions and the increasing demand for device performance, dipole engineering can have its challenges. For example, the dopant source layer on the gate dielectric layer can mix with the high-k dielectric layer and form compound particle defects that may not be removed during a subsequent etching process to remove the dopant source layer. In addition, the etch selectivity between the dopant source layer and the high-k dielectric layer may not be sufficient to prevent non-uniform and/or excessive loss of the high-k dielectric layer during the etching process. The term "etch selectivity" can refer to the ratio of the etch rates of two different materials under the same etching conditions. Moreover, the uniformity of the dopant source layer degrades as the thickness of the dopant source layer continues to scale down to achieve a smaller dopant dipole requirement at the interface of the high-k dielectric layer and the interfacial layer for a smaller $V_t$ shift. Furthermore, moisture can attack the dopant source layer during a wet clean process and form oxyhydrides in the gate dielectric layer, which can lower the dielectric constant of the gate dielectric layer, thereby increasing effective oxide thickness and decreasing the device speed.

Various embodiments of the present disclosure provide methods for forming a semiconductor device with a gate dielectric layer with controlled doping. In some embodiments, a gate dielectric layer of the semiconductor device can be formed on a fin structure. The gate dielectric layer can include an interfacial layer on the fin structure and a high-k dielectric layer on the interfacial layer. In some embodiments, a diffusion barrier layer can be formed on the gate dielectric layer. A dopant source layer can be formed on the diffusion barrier layer to dope a portion of the high-k dielectric layer and the interfacial layer, form various intermixed layers, and form dopant dipoles at the interface of the high-k dielectric layer and the interfacial layer. The dopant source layer can include aluminum oxide ($AlO_x$), magnesium oxide (MgO), lanthanum oxide ($La_2O_3$), lutetium oxide ($Lu_2O_3$), scandium oxide ($Sc_2O_3$), strontium oxide (SrO), zirconium oxide ($ZrO_2$), yttrium oxide ($Y_2O_3$), dysprosium oxide ($DyO_x$), europium oxide ($EuO_x$), erbium oxide ($ErO_x$), ytterbium oxide ($Yb_2O_3$), and other suitable rare earth metal oxides, alkaline earth metal oxide, and transition metal oxides to form dopant dipoles at the interface. The dopant source layer can be removed after the doping process.

The diffusion barrier layer can prevent mixing of the dopant source layer and the high-k dielectric layer, thus reducing compound particle defects from the dopant source layer and the high-k dielectric layer. A uniform dopant profile across fin and gate structures can be achieved with the diffusion barrier layer. With the dopant diffused from the dopant source layer through the diffusion barrier layer to the interface of the high-k dielectric layer and interfacial layer, a lower dopant concentration (e.g., less than about $5 \times 10^{13}$ atoms/cm$^2$) and a smaller dopant dipole at the interface can be achieved for smaller $V_t$ shift (e.g., about 30 mV or less), uniformly throughout the wafer. The doped portion of the interfacial layer can have a higher dielectric constant (k value) and thus reduce the effective oxide thickness (EOT) of the interfacial layer. The dopant source layer may not require a patterning process or a wet clean process before the doping operation, thereby avoiding the formation of hydroxides having lower k value. In addition, the dopant source layer can have no exposure to moisture during the doping process. In some embodiments, the diffusion barrier layer can be removed completely or partially before depositing a gate electrode. In some embodiments, a nitridation treatment is performed on the diffusion barrier layer and the diffusion barrier layer can be a part of the gate electrode. In some embodiments, a thickness of the doped portion of the interfacial layer can depend on a thickness of the diffusion barrier layer. In some embodiments, an intermixing layer of the diffusion barrier layer and the high-k dielectric layer can be formed at the interface of these two layers. The intermixing layer can prevent metal (e.g., aluminum) diffusion from work function layers of the gate electrode into the high-k dielectric layer and improve the device reliability, device leakage, and control of $V_t$ shifts due to the metal diffusion. In some embodiments, the diffusion barrier layer and the dopant source layer can be formed on the interfacial layer. After doping a portion of the interfacial layer with the dopant, the dopant source layer and the diffusion barrier layer can be removed. The high-k dielectric layer and the gate electrode can be formed on the doped interfacial layer.

Figure 1B:
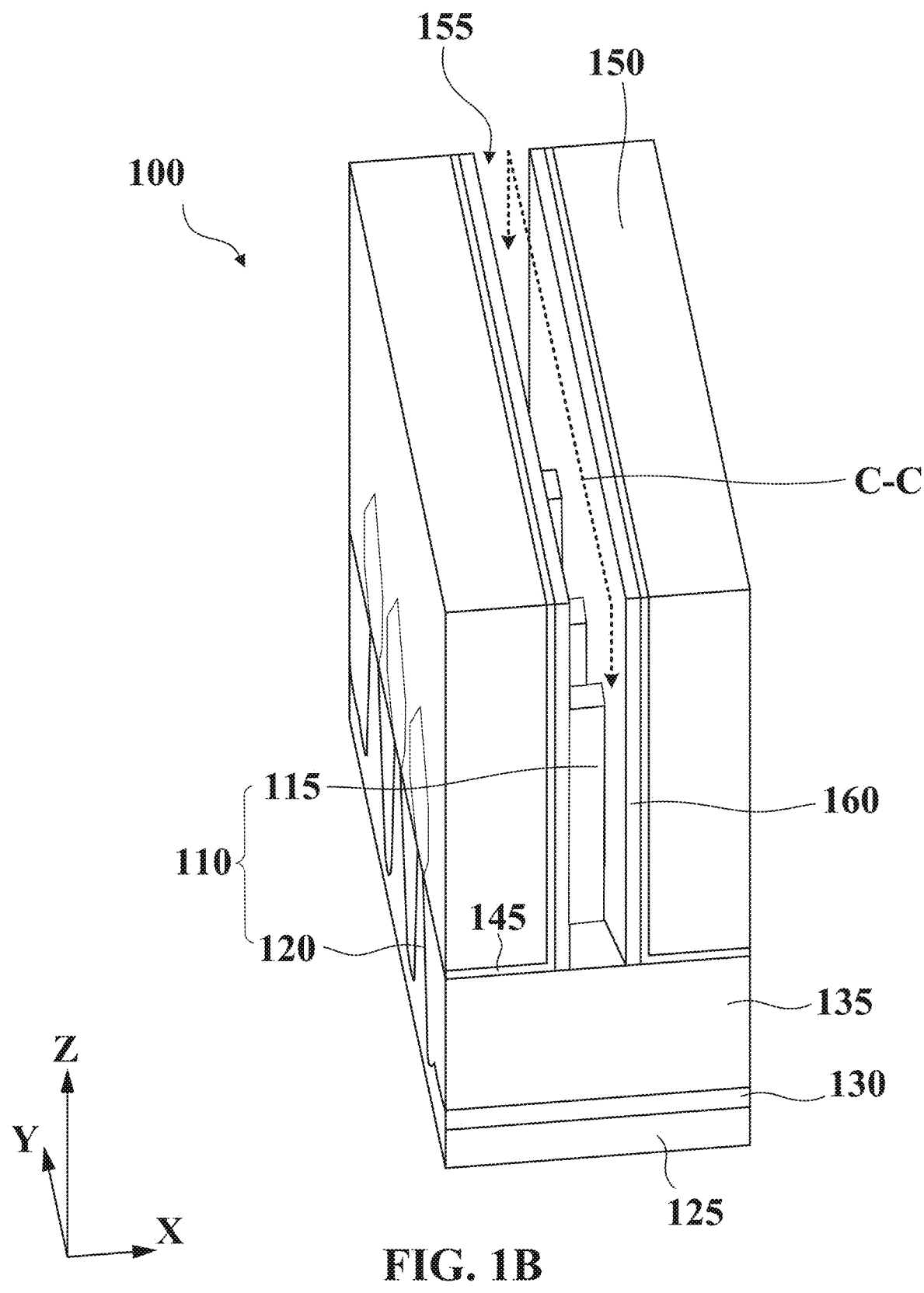
Figure 1C:
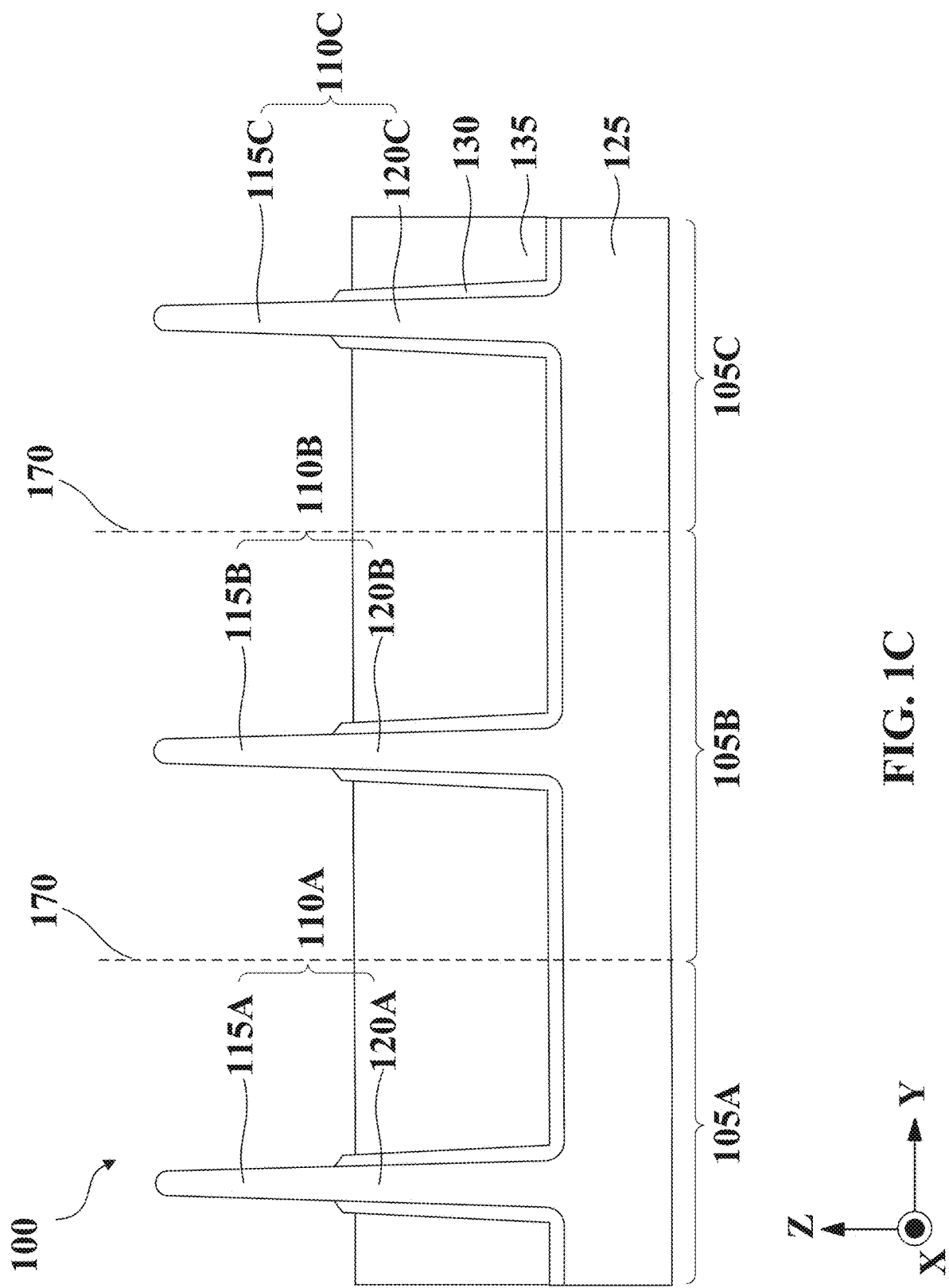

FIGS. 1A and 1B illustrate isometric views of a partially-fabricated semiconductor device 100 after the removal of a sacrificial gate stack, in accordance with some embodiments. In some embodiments, FIG. 1B shows partially-fabricated semiconductor device 100 of FIG. 1A after being rotated clock wise around the Z-axis by about 45 degrees. In other words, FIG. 1B is another view of fabricated semiconductor device 100 shown in FIG. 1A. FIG. 1C illustrates a cross-sectional view along line C-C of the partially-fabricated semiconductor device 100, according to some embodiments.

As shown in FIGS. 1A-1C, partially-fabricated semiconductor device 100 includes a FET 105A, a FET 105B, and a FET 105C formed on a substrate 125. In some embodiments, FETs 105A, 105B, and 105C can be fabricated in subsequent processes with different gate dielectric layer dopings to form different dipoles at the interface of the high-k dielectric layer and the interfacial layer for different $V_t$. In some embodiments, FETs 105A, 105B, and 105C can be finFETs, gate-all-around FETs (GAA FETs), planar FETs, or other suitable FET devices. In some embodiments, FETs 105A, 105B, and 105C can be all p-type FETs (PFETs), all n-type FETs (NFETs), or one of each conductivity type FET with different $V_t$. Though FIGS. 1A-1C show three FETs, semiconductor device 100 can have any number of FETs. Also, though FIGS. 1A-1C show one gate stack opening 155, semiconductor device 100 can have additional gate stack openings similar and parallel to gate stack opening 155. The discussion of elements of FETs 105A, 105B, and 105C with the same annotations applies to each other, unless mentioned otherwise.

As shown in FIGS. 1A-1C, FETs 105A, 105B, and 105C can be formed on substrate 125. In some embodiments, substrate 125 can include a semiconductor material such as crystalline silicon. In some embodiments, substrate 125 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GaInAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Alternatively, the substrate can be made from an electrically non-conductive material, such as glass and sapphire wafer. Further, substrate 125 can be doped depending on design requirements (e.g., p-type substrate or n-type substrate). In some embodiments, substrate 125 can be doped with p-type dopants (e.g., boron, indium, aluminum, or gallium) or n-type dopants (e.g., phosphorus or arsenic). For example purposes, substrate 125 will be described in the context of crystalline silicon (Si).

Based on the disclosure herein, other materials, as discussed above, can be used. These materials are within the spirit and scope of this disclosure.

Referring to FIGS. 1A-1C, semiconductor device 100 can include additional structural elements, such as fin structures 110, a liner 130, an insulating layer 135, source/drain (S/D) epitaxial fin structures 140, an etch stop layer 145, an isolation layer 150, a gate stack opening 155 formed in isolation layer 150, and gate spacers 160 formed on sidewall surfaces of isolation layer 150 in gate stack opening 155.

Fin structures 110A, 110B, and 110C (also collectively referred to as "fin structures 110") can include fin top portions 115A, 115B, and 115C (also collectively referred to as "fin top portions 115") and fin bottom portions 120A, 120B, and 120C (also collectively referred to as "fin bottom portions 120") respectively, as shown in FIGS. 1A-1C. In some embodiments, fin top portions 115 can be a single fin structure. In some embodiments, fin top portions 115 can include a stack of semiconductor layers (e.g., a stack of nanosheets, nanowires, or nano-fork sheets for GAA FETs). In some embodiments, fin top portions 115 can include semiconductor materials similar to or different from fin bottom portions 120. In some embodiments, fin top portions 115 and fin bottom portions 120 can include a semiconductor material the same as substrate 125, such as crystalline Si.

Fin structures 110 may be formed by patterning with any suitable method. For example, fin structures 110 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. In some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern fin structures 110.

In some embodiments, insulating layer 135 can be an isolation structure, such as a shallow trench isolation (STI), that provides electrical isolation between FETs 105A, 105B, and 105C from each other and from neighboring FETs with different fin structures (not shown) on substrate 125 and/or neighboring active and passive elements (not shown) integrated with or deposited on substrate 125. In some embodiments, an insulating layer can be a layer that functions as an electrical insulator (e.g., a dielectric layer). In some embodiments, insulating layer 135 can include silicon oxide (SiO$_2$), silicon nitride (Si$_3$N$_4$), silicon oxy-nitride (SiON), fluorine-doped silicate glass (FSG), phosphorous-doped silicate glass (PSG), a low-k dielectric material (e.g., with k-value less than about 3.9), and/or other suitable dielectric materials with appropriate fill properties. In some embodiments, liner 130 is a nitride layer, such as silicon nitride.

Referring to FIGS. 1A-1C, S/D epitaxial fin structures 140 can be disposed on fin bottom portions 120 and abut gate spacers 160, extending along an X-axis within isolation layer 150. In some embodiments, S/D epitaxial fin structures 140 can have any geometric shape, such as a polygon, an ellipsis, and a circle. S/D epitaxial fin structures 140 can include an epitaxially-grown semiconductor material. In some embodiments, the epitaxially-grown semiconductor material includes the same material as substrate 125. In some embodiments, the epitaxially-grown semiconductor material includes a different material from substrate 125. In some embodiments, the epitaxially-grown semiconductor material for each of S/D epitaxial fin structures 140 can be the same as or different from each other. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, S/D epitaxial fin structures 140 can be p-type for a PFET and n-type for an NFET. In some embodiments, p-type S/D epitaxial fin structures 140 can include SiGe and can be in-situ doped during an epitaxial growth process using p-type dopants, such as boron, indium, and gallium. In some embodiments, p-type S/D epitaxial fin structures 140 can have multiple sub-regions that can include SiGe and can differ from each other based on, for example, doping concentrations, epitaxial growth process conditions, and/or a relative concentration of Ge with respect to Si. In some embodiments, n-type S/D epitaxial fin structures 140 can include Si and can be in-situ doped during an epitaxial growth process using n-type dopants, such as phosphorus and arsenic. In some embodiments, n-type S/D epitaxial fin structures 140 can have multiple n-type epitaxial fin sub-regions that can differ from each other based on, for example, doping concentration and/or epitaxial growth process conditions.

Referring to FIGS. 1A-1C, fin structures 110A-110C can be current-carrying structures for respective FETs 105A, 105B, and 105C. Channel regions of FETs 105A, 105B, and 105C can be formed in portions of their respective fin top portions 115A, 115B, and 115C in gate stack opening 155. S/D epitaxial fin structures 140A, 140B, and 140C can function as S/D regions of respective FETs 105A, 105B, and 105C.

Referring to FIGS. 1A-1C, etch stop layer 145 can extend over insulating layer 135, S/D epitaxial fin structures 140, and gate spacers 160. In some embodiments, etch stop layer 145 can function as a layer to stop etch in a subsequent etching process during the formation of S/D contact openings on S/D epitaxial fin structures 140. In some embodiments, etch stop layer 145 can have a thickness that ranges from about 3 nm to about 5 nm. In some embodiments, etch stop layer 145 can be deposited by a conformal deposition process, such as atomic layer deposition (ALD), plasma-enhanced ALD (PEALD), chemical vapor deposition (CVD), plasma-enhanced CVD (PECVD), and any other suitable deposition method.

Isolation layer 150 can surround S/D epitaxial fin structures 140 and be formed prior to the formation of gate stack opening 155. After the removal of sacrificial gate stacks (not shown), gate stack opening 155 can be formed in isolation layer 150, as shown in FIGS. 1A and 1B. In some embodiments, isolation layer 150 can be an interlayer dielectric (ILD) that includes a silicon oxide-based dielectric material with or without carbon and/or nitrogen. In some embodiments, isolation layer 150 can be deposited by CVD, physical vapor deposition (PVD), or any other suitable deposition method.

Gate spacers 160 can be a stack of one or more layers that include the same or different materials. In some embodiments, gate spacers 160 can include a dielectric material, such as silicon oxynitride (SiON), silicon carbon nitride (SiCN), silicon oxycarbide (SiOC), silicon nitride, or a combination thereof. In some embodiments, gate spacers 160 can have a thickness ranging from about 2 nm to about 5 nm. According to some embodiments, gate spacers 160 can be deposited on sidewall surfaces of sacrificial gate stacks, which are later removed during a gate replacement process to form gate stack opening 155. In FIGS. 1A-1C, gate spacers 160 function as structural elements for the metal gate stack to be formed in gate stack opening 155 in subsequent processes.

Figure 2:
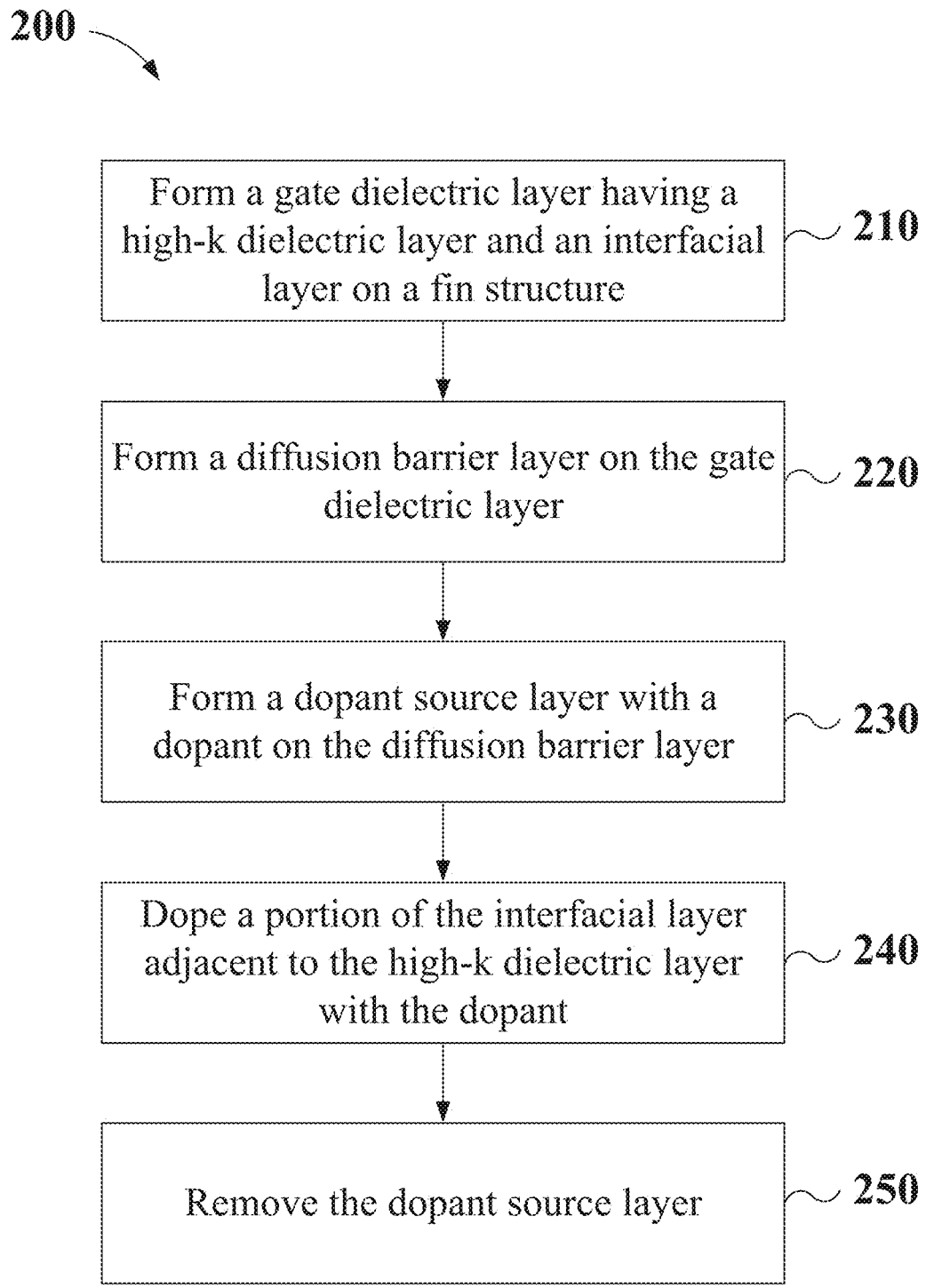
FIG. 2 is a flow diagram of a method for fabricating a semiconductor device having a gate dielectric layer with controlled doping, in accordance with some embodiments.

Referring to FIG. 1C, semiconductor device 100 can further include metal boundaries 170 between FETs 105A and 105B and between FETs 105B and 105C. Metal boundaries 170 can be a boundary where gate metal stacks of FET 105B border gate metal stacks of FETs 105A or 105C, for example, N—P metal boundary between FET 105A and FET 105B. In some embodiments, metal boundaries 170 can be in the middle between fin structures 110A and 110B and between fin structures 110B and 110C. Fabrication processes of gate dielectric layer and metal stacks on fin structures 110A-110C will be described in details at regions 175A-175C respectively, as shown in FIG. 1C. The fabrication processes apply to the gate dielectric layer and metal stacks for FETs 105A, 105B, and 105C at metal boundaries 170, unless mentioned otherwise FIG. 2 is a flow diagram of method 200 for fabricating a semiconductor device having a gate dielectric layer with controlled doping, according to some embodiments. Method 200 may not be limited to finFET devices and can be applicable to devices that would benefit from controlled doping at the interface of the high-k dielectric layer and the interfacial layer of the gate dielectric layer, such as planar FETs, GAA FETs, etc. Additional fabrication operations may be performed between various operations of method 200 and may be omitted merely for clarity and ease of description. Additional processes can be provided before, during, and/or after method 200; one or more of these additional processes are briefly described herein. Moreover, not all operations may be needed to perform the disclosure provided herein. Additionally, some of the operations may be performed simultaneously or in a different order than shown in FIG. 2. In some embodiments, one or more other operations may be performed in addition to or in place of the presently described operations.

For illustrative purposes, the operations illustrated in FIG. 2 will be described with reference to the example fabrication process for fabricating semiconductor device 100 having a gate dielectric layer with controlled doping as illustrated in FIGS. 3A-12B. FIGS. 3A-10 illustrate partial cross-sectional views along a Y-axis of semiconductor device 100 having gate dielectric layer 303 with controlled doping at various stages of its fabrication process, in accordance with some embodiments. FIGS. 11A-12B illustrate partial cross-sectional views along an X-axis of semiconductor device 100 having gate dielectric layer 303 with controlled doping after the operations of the fabrication process, in accordance with some embodiments. Although FIGS. 11A-12B illustrate semiconductor device 100 having gate dielectric layer 303 with controlled doping for finFETs and GAA FETs, method 200 can be applied to other semiconductor devices, such as planar FETs with different $V_t$. Elements in FIGS. 3A-12B with the same annotations as elements in FIGS. 1A-1C are described above.

Figure 3A:
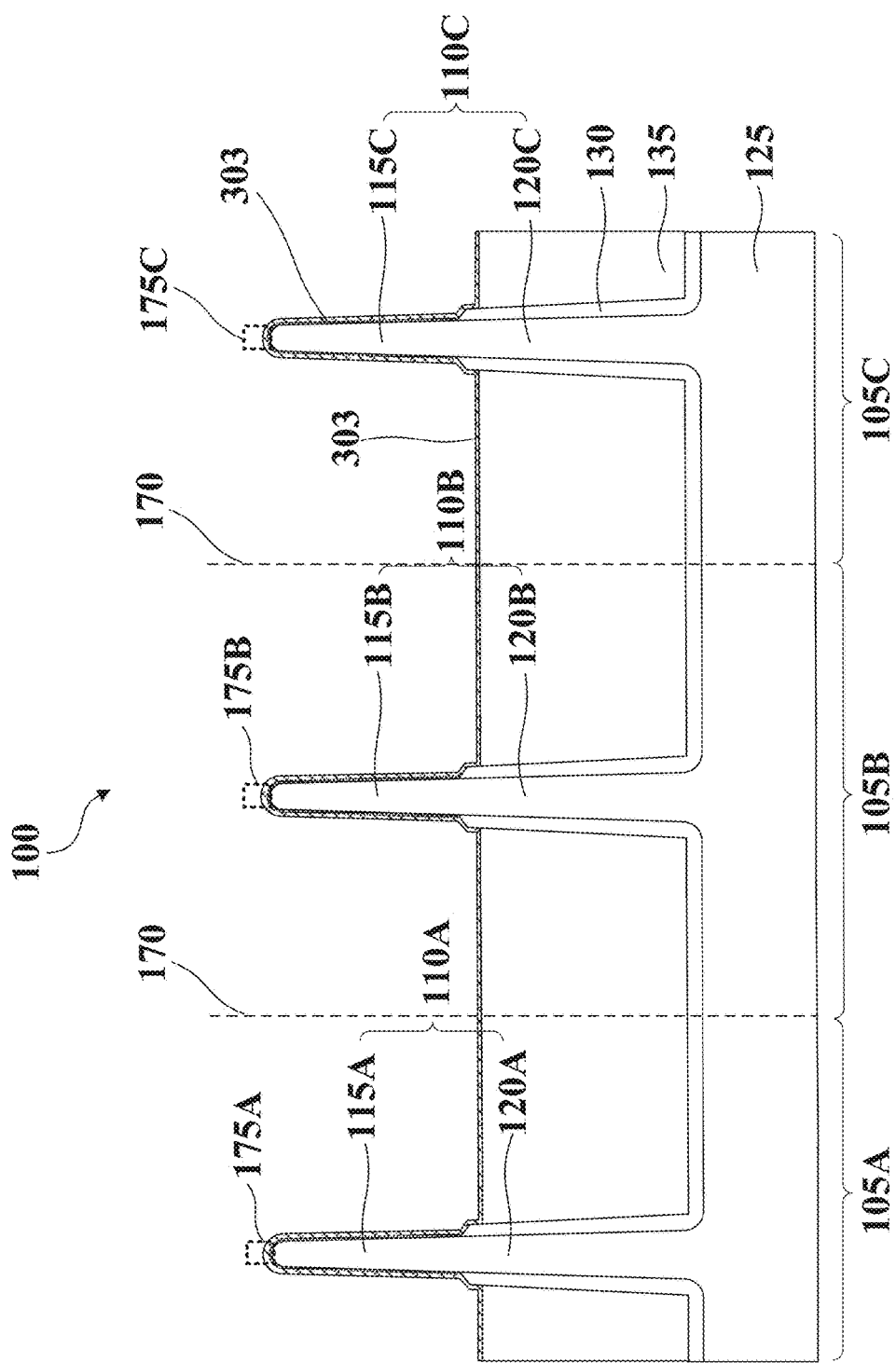
Figure 3B:
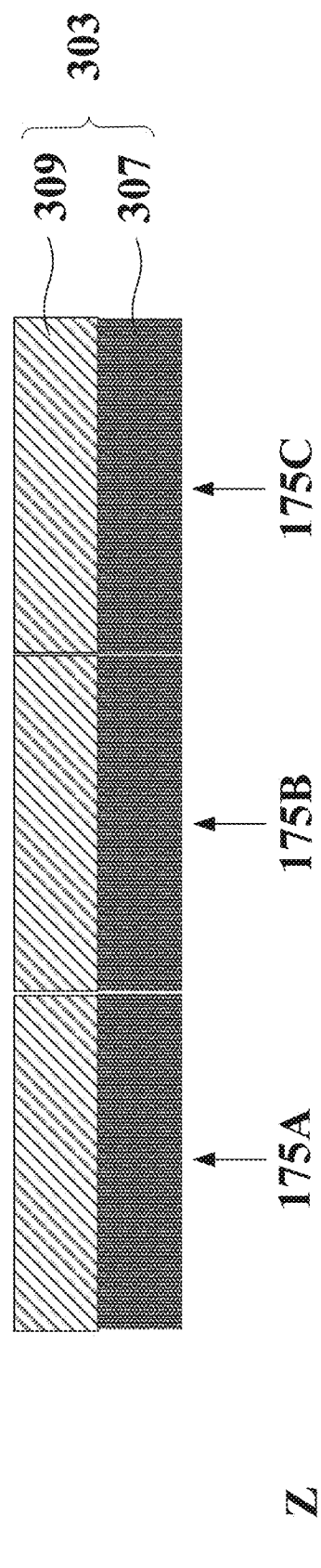
Figure 4:
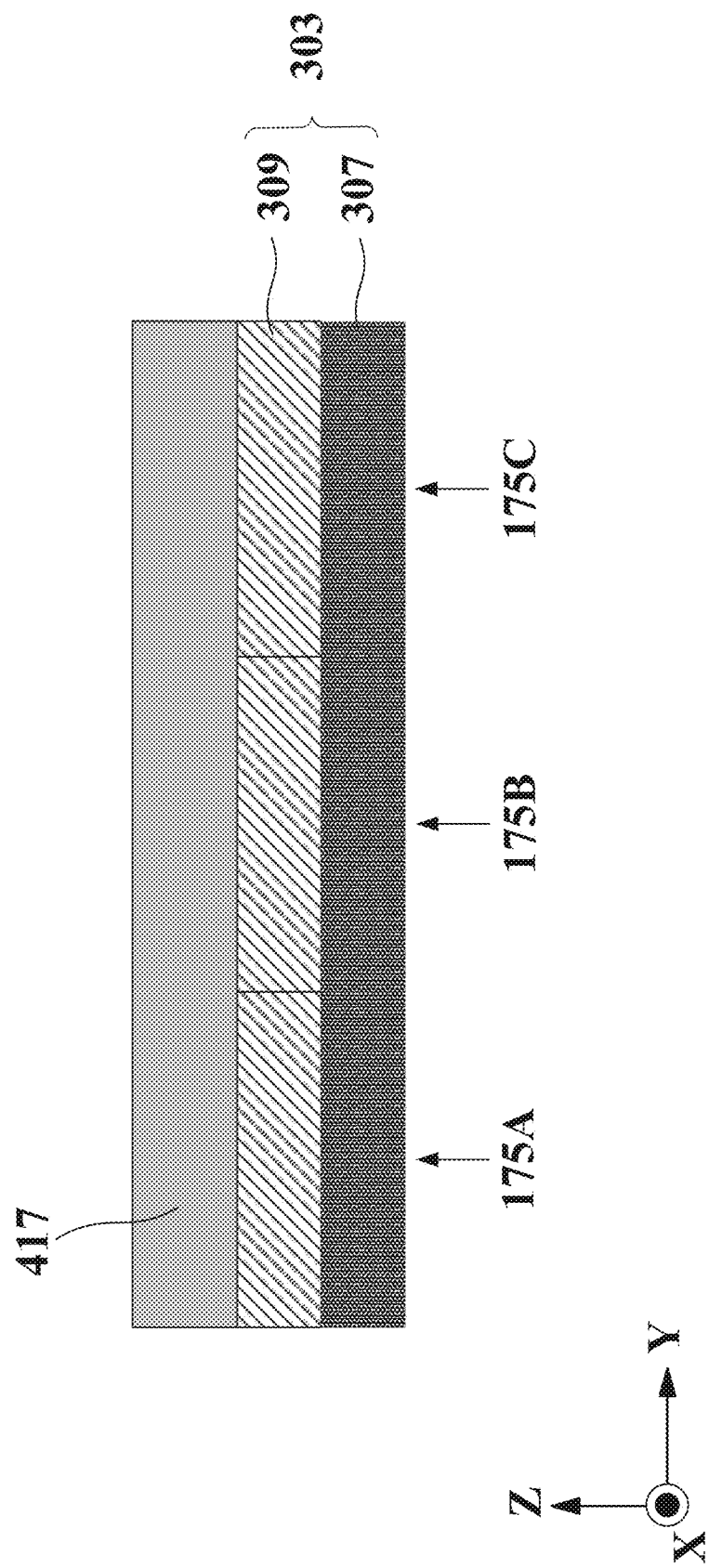

Referring to FIG. 2, method 200 begins with operation 210 and the process of forming gate dielectric layer 303 having high-k dielectric layer 309 and interfacial layer 307 on fin structures 110A-110C and insulating layer 135 between fin structures 110A-110C within gate stack opening 155 as shown in FIGS. 1A-1C. According to some embodiments, FIG. 3A is a cross-sectional view of semiconductor device 100 shown in FIG. 1C after operation 210 of method 200, FIG. 3B is an enlarged cross-sectional view of regions 175A-175C of semiconductor device 100 shown in FIG. 3A. Regions 175A-175C can represent the gate structures formed on fin structures 110A-110C respectively. In some embodiments, various gate structures formed on fin structures 110A-110C in FIGS. 3A and 3B can represent the gate structures formed on insulating layer 135 of FETs 105A, 105B, and 105C. respectively.

According to FIGS. 3A and 3B, gate dielectric layer 303 can be formed on fin structures 110 and insulating layer 135. Gate dielectric layer 303 can be formed in gate stack opening 155 between gate spacers 160 as shown in FIGS. 1A and 1B. In some embodiments, gate dielectric layer 303 can be a gate dielectric stack that includes an interfacial layer 307 and a high-k dielectric layer 309. In some embodiments, interfacial layer 307 can be formed by exposing the silicon surfaces of fin structures 110 to an oxidizing ambient. In some embodiments, the oxidizing ambient can include a combination of ozone ($O_3$), ammonia hydroxide/hydrogen peroxide/water mixture (SC1), and hydrochloric acid/hydrogen peroxide/water mixture (SC2). As a result of the aforementioned oxidation process, a silicon oxide layer between about 5 Å and about 15 Å can be formed on exposed silicon surfaces, such as the surfaces of fin structures 110 in gate stack opening 155, but not on insulating layer 135. Therefore, gate dielectric layer 303 on fin structures 110 can include interfacial layer 307 and high-k dielectric layer 309, and gate dielectric layer 303 on insulating layer 135 can only include high-k dielectric layer 309, according to some embodiments. In some embodiments, interfacial layer 307 can include a silicon oxide layer with a thickness from about 5 Å to about 15 Å and deposited by ALD, CVD, or any other suitable deposition method. As a result of the deposition process, the silicon oxide layer can cover fin structures 110 and insulating layer 135. In some embodiments, high-k dielectric layer 309 can include a dielectric material with a dielectric constant (k-value) higher than about 3.9. In some embodiments, high-k layer dielectric 309 can include hafnium oxide, aluminum oxide, zirconium oxide, or other suitable high-k dielectric materials deposited by ALD, CVD, or PEALD at a thickness 309t from about 10 Å to about 75 Å.

Referring to FIG. 2, method 200 continues with operation 220 and the process of forming a diffusion barrier layer on the gate dielectric layer. As shown in FIGS. 4-8B, one or more diffusion barrier layers can be formed on gate dielectric layer 303 at regions 175A-175C. In some embodiments, FETs 105A, 105B, and 105C can have different number of diffusion barrier layers or different total thicknesses of diffusion barrier layers at regions 175A-175C. The number of diffusion barrier layers or the total thickness of the diffusion barrier layers can control an amount of dopant diffusing through the diffusion barrier layers. For example, the greater the number of the diffusion barrier layers, or the thicker the diffusion barrier layers, the less the dopant diffuses through the diffusion barrier layer. The less the dopant diffuses through the diffusion barrier layer, the smaller the dipoles can form at the interface of interfacial layer 307 and high-k dielectric layer 309. The amount of dipole formed at the interface of interfacial layer 307 and high-k dielectric layer 309 can control the $V_t$ shift of FETs 105A, 105B, and 105C. The diffusion barrier layers can also avoid direct contact and mixing of high-k dielectric layer 309 with subsequently deposited dopant source layer, thus preventing the formation of compound particle defects and allowing separate controlled etching of the dopant source layer and the diffusion barrier layers.

Figure 5:
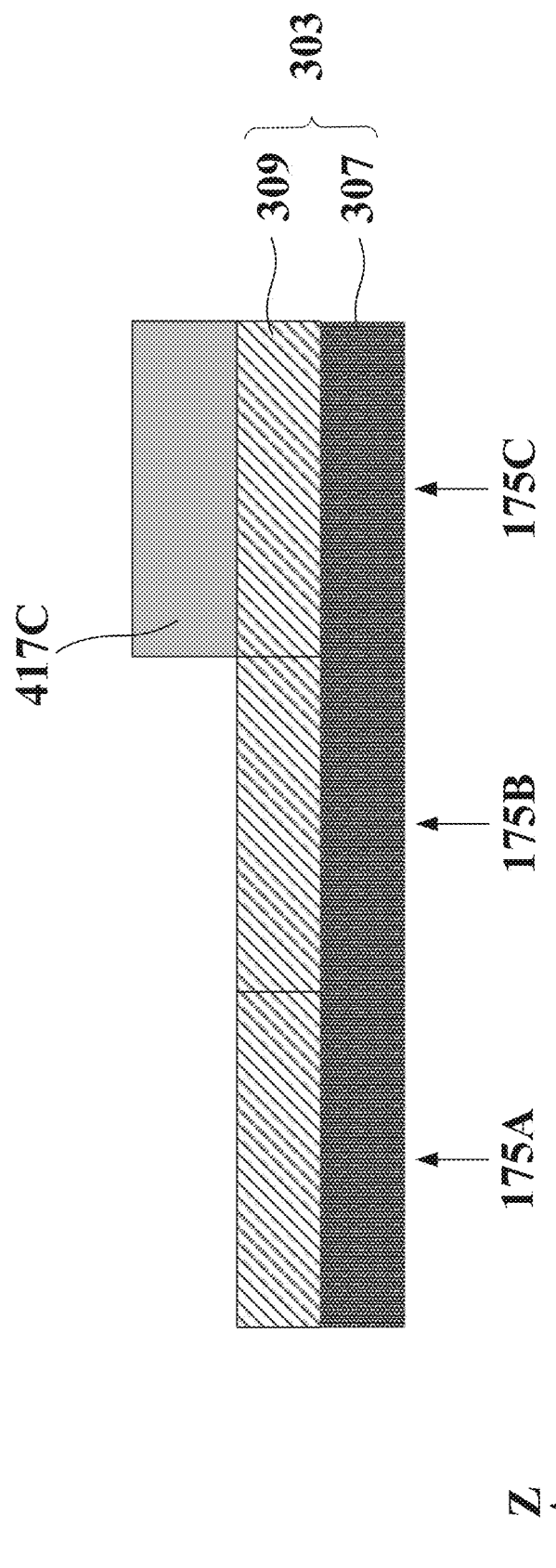
Figure 6:
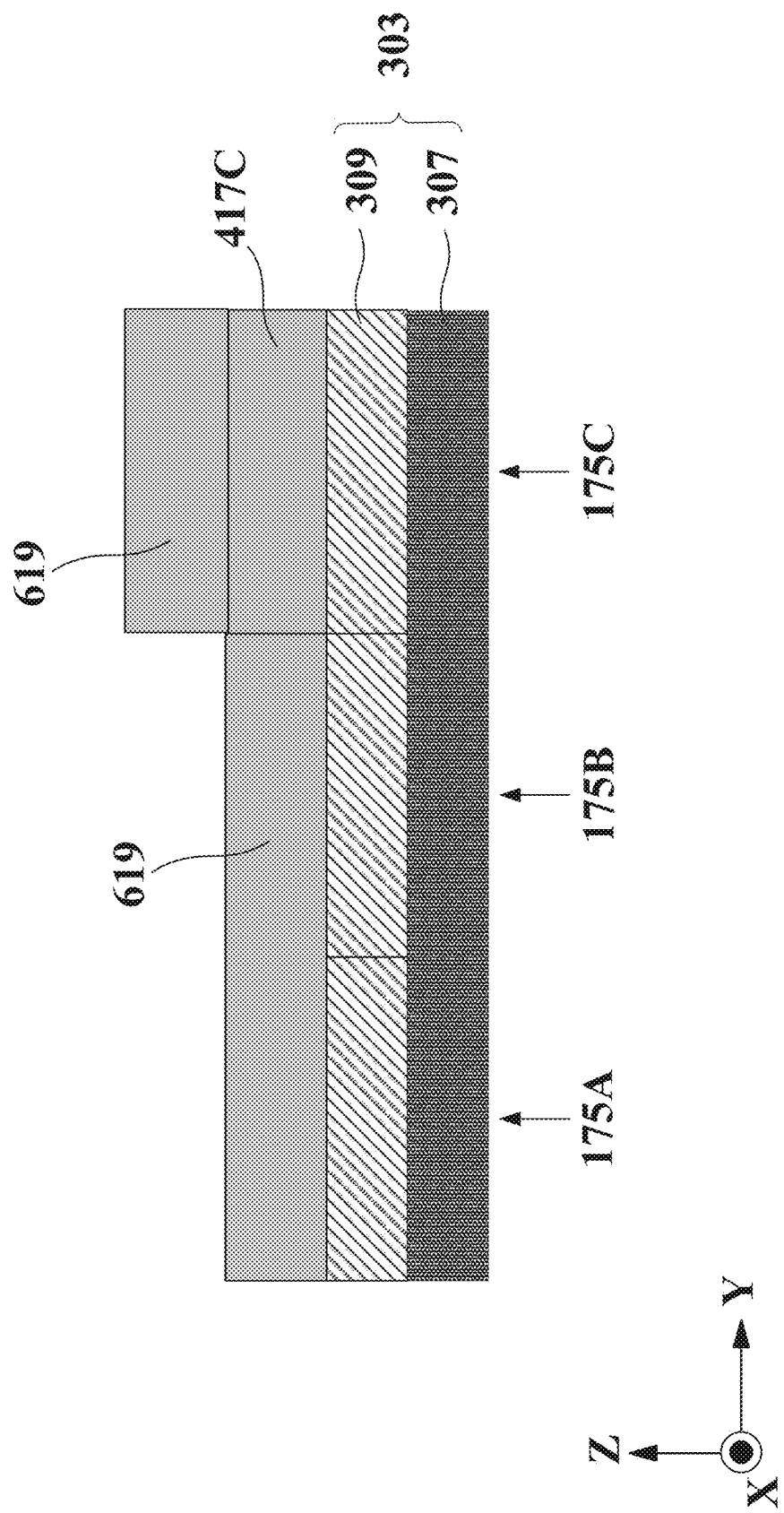
Figure 7:
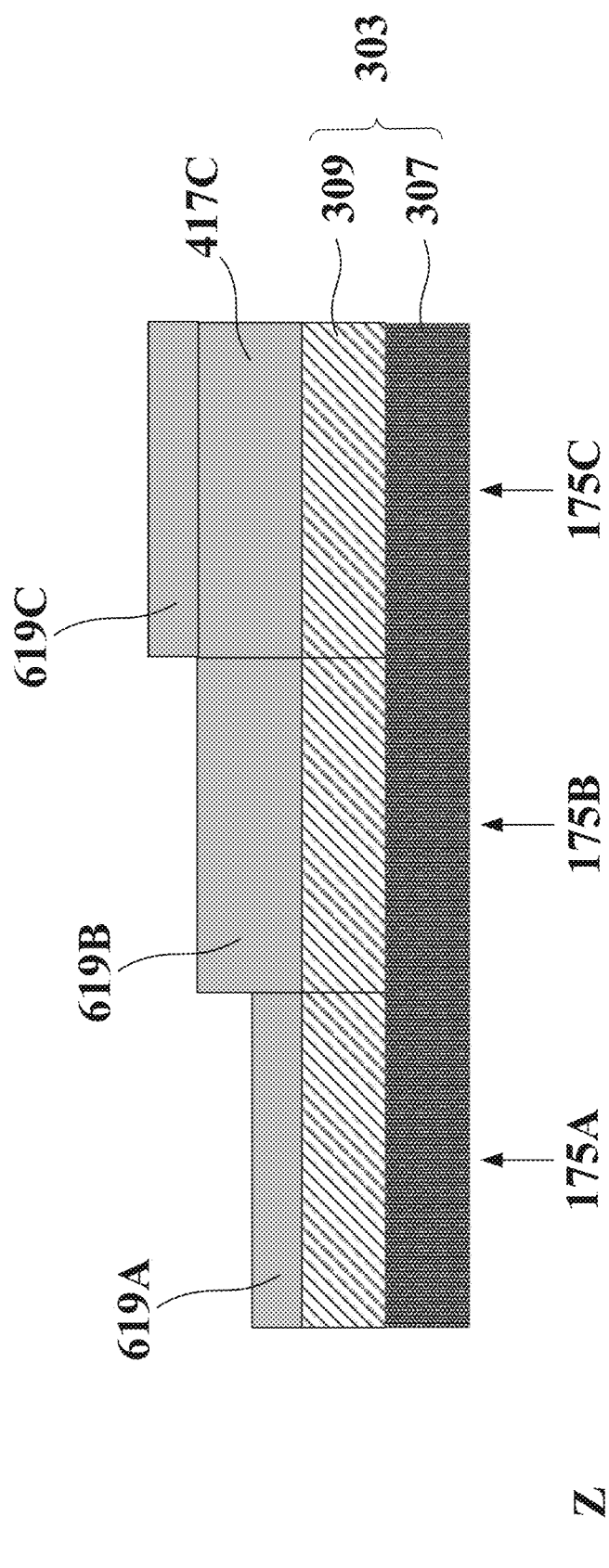
Figure 8A:
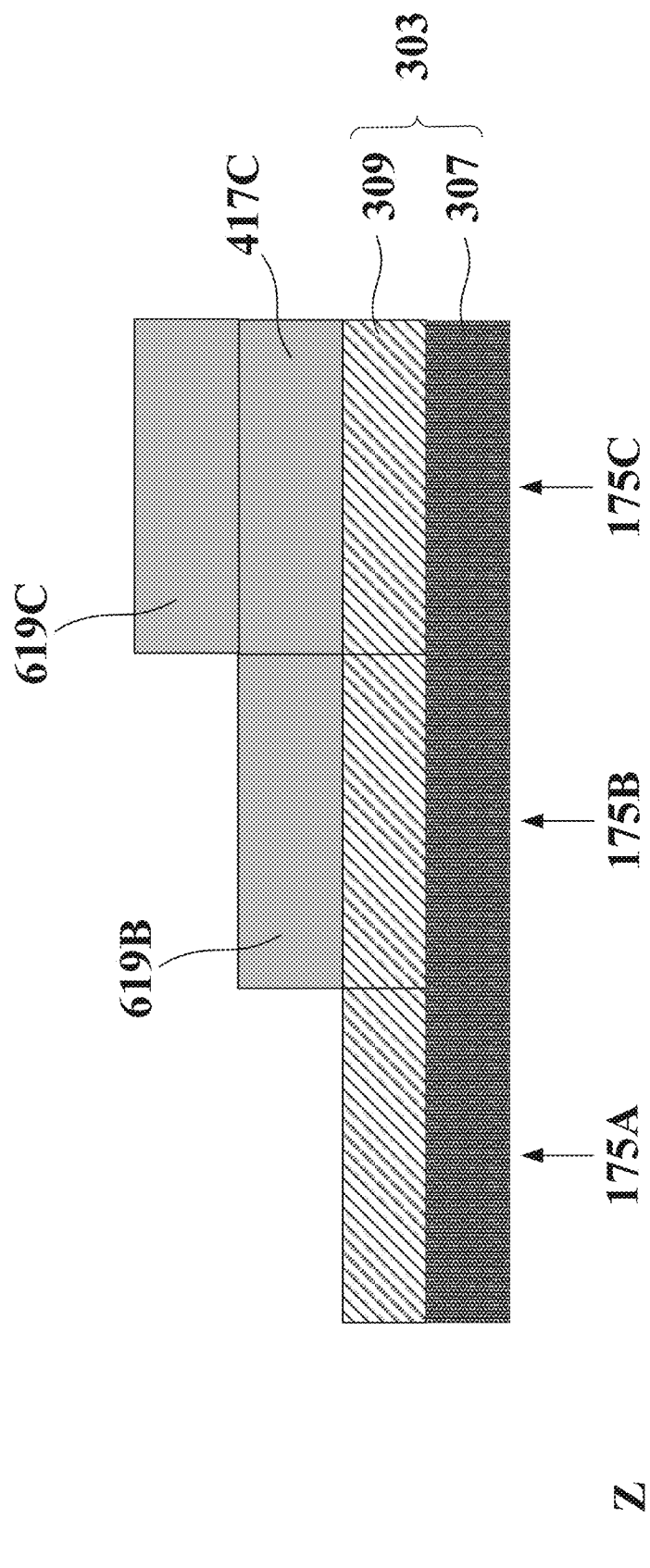
Figure 8B:
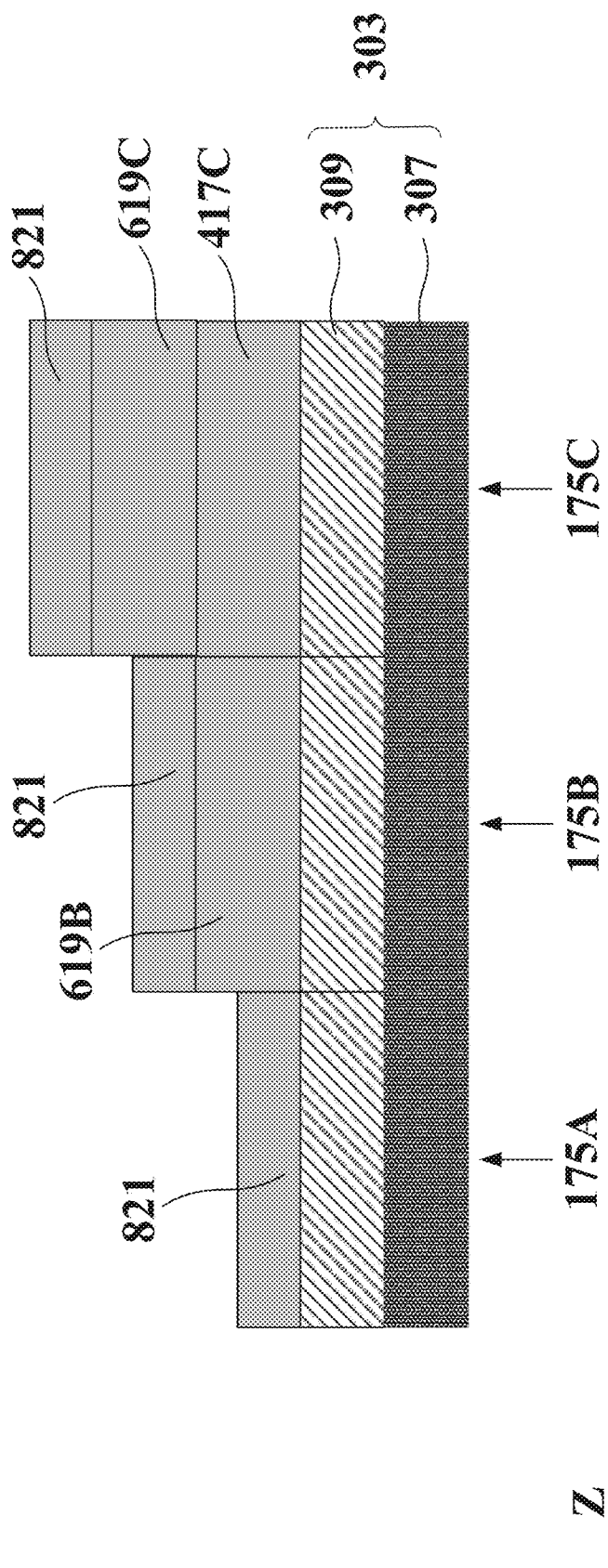

FETs with a different number of diffusion barrier layers, or different total thicknesses of diffusion barrier layers, can be achieved by photolithography and etching operations or by selective deposition operations. By way of example and not limitation, a first diffusion barrier layer 417 can be deposited concurrently on gate dielectric layer 303 at regions 175A-175C. In some embodiments, the FETs receiving the largest number of diffusion barrier layers are subsequently masked with a photoresist so that first diffusion barrier layer 417 can be removed via etching from the FETs receiving fewer diffusion barrier layers, such as FET 105A and FET 105B. As shown in FIG. 5, first diffusion barrier layer 417 can be removed from region 175A and region 175B. First diffusion barrier layer 417C can remain on gate dielectric layer 303 at region 175C. Once first diffusion barrier layer 417 has been removed from FETs 105A and 105B receiving fewer diffusion barrier layers, the photoresist is removed from FET 105C receiving the largest number of diffusion barrier layers, and the process resumes with the deposition of a second diffusion barrier layer 619, as shown in FIG. 6. In some embodiments, a photoresist is subsequently used to mask the second largest number of diffusion barrier layers. A subsequent etching process removes a portion of second diffusion barrier layer 619 from the FETs receiving thinner diffusion barriers (e.g., FET 105A) and the largest number of diffusion barrier layers (e.g., FET 105C). As shown in FIG. 7, second diffusion barrier layer 619 on gate dielectric layer 303 at region 175A and region 175C can be partially removed to form diffusion barrier layers with different total thicknesses for FETs 105A, 105B, and 105C. In some embodiments, after the deposition of second diffusion barrier layer 619, a photoresist is subsequently used to mask the FETs receiving the largest and the second largest number of diffusion barrier layers (e.g., region 175B of FET 105B and region 175C of FET 105C). A subsequent etching process removes second diffusion barrier layer 619 from the FETs receiving fewer diffusion barriers (e.g., FET 105A) and keeps second diffusion barrier layer 619 on the FETs with the largest and the second largest number of diffusion barrier layers (e.g., FETs 105B and FET 105C). As shown in FIG. 8A, second diffusion barrier layer 619 can be removed from region 175A and second diffusion barrier layer 619 can remain on gate dielectric layer 303 at region 175B and region 175C. A third diffusion barrier layer 821 can be deposited concurrently at regions 175A-175C. As a result of aforementioned deposition and etching processes, FETs 105A, 105B, and 105C can have different numbers of or different total thicknesses of diffusion barrier layers, as shown in FIG. 8B. In some embodiments, different diffusion barrier layers can have different compositions. In some embodiments, different diffusion barrier layers can have different percentages of crystallinity. For example, first, second, and third diffusion barrier layers 417, 619, and 821, respectively, can have compositions and/or percentages of crystallinity different from each other.

The aforementioned deposition, photolithography, and etching operations repeats until all FETs receive the appropriate number of or total thickness of diffusion barrier layers. The aforementioned formation sequence of the diffusion barrier layer is not limiting and other sequences using similar or different operations may be performed. Method 200 provides FETs with different $V_t$ based on different numbers of or different total thicknesses of diffusion barrier layers as discussed above.

By way of example and not limitation, each of diffusion barrier layers 417, 619, and 821 can be deposited by ALD, PEALD, CVD, or other suitable deposition methods at a temperature ranging from about 200° C. to about 650° C. with a pressure ranging from about 1 torr to about 600 torr. The deposition process can use precursors including pentakis dimethylamino tantalum (PDMAT), tetrakis dimethylamido titanium (TDMAT), titanium tetrachloride ($TiCl_4$), tantalum chloride ($TaCl_5$), ammonia ($NH_3$), silane ($SiH_4$), silicon tetrachloride ($SiCl_4$), dichlorosilane ($SiH_2Cl_2$), trichlorosilane ($SiHCl_3$), nitrogen ($N_2$)-plasma, trimethylaluminum (TMA), triethylaluminum (TEA), or other suitable precursors at a gas flow rate ranging from about 5 sccm to about 20000 sccm. The deposition process can include one or more cycles of precursor pulse and purge. The precursor pulse time in each cycle can range from about 0.05 s to about 120 s, and the purge time can range from about 0.2 s to about 300 s. The deposition rate per cycle can range from about 2 Å/cycle to about 150 Å/cycle.

Figure 13:
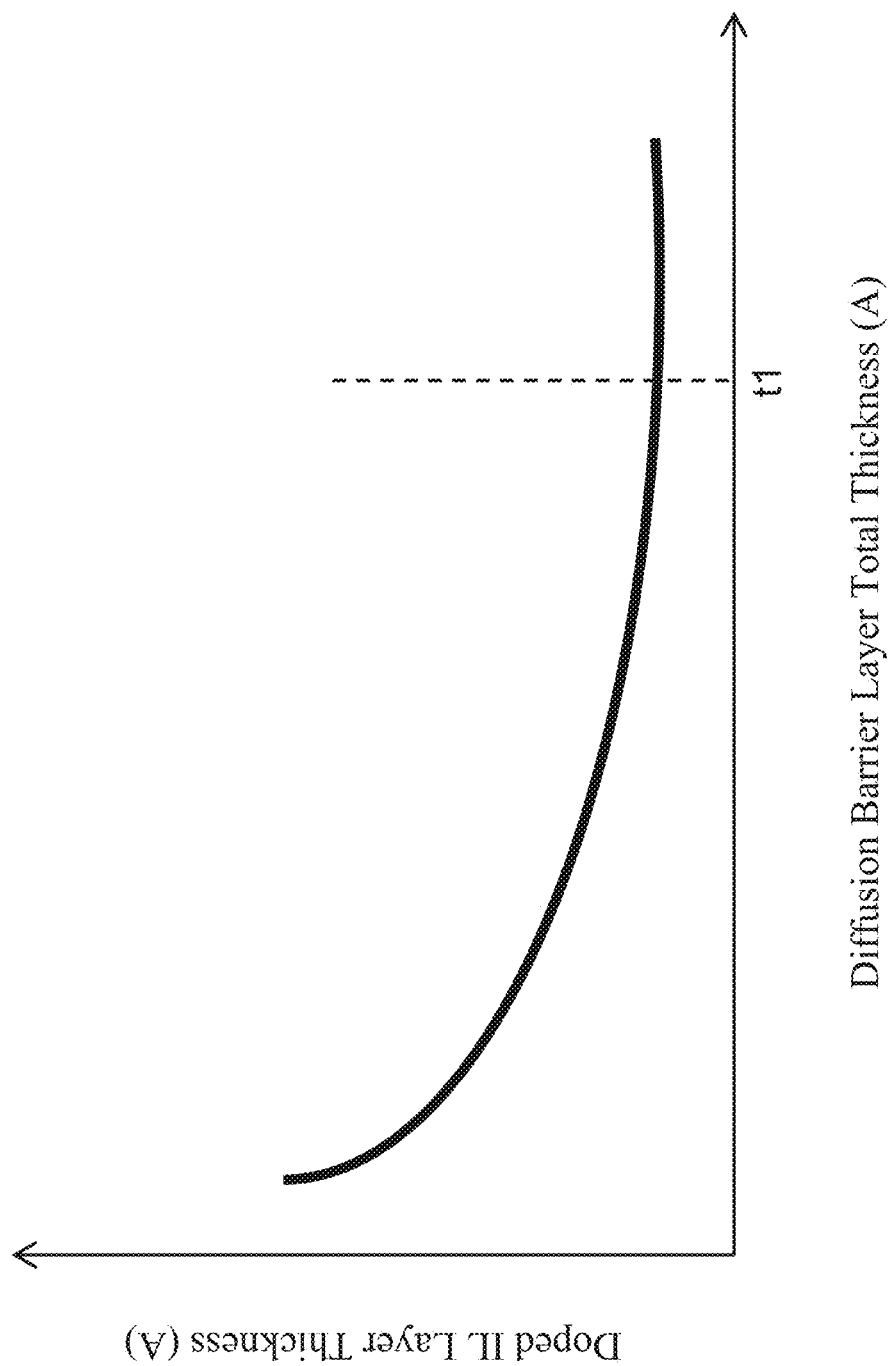
FIG. 13 illustrates a relationship between doped interfacial layer (IL) thickness and diffusion barrier layer thickness, in accordance with some embodiments.

The total thickness along a Z-axis of the diffusion barrier layers for each FET can range from about 3 Å to about 300 Å. If the total thickness is less than about 3 Å, high-k dielectric layer 309 can mix subsequently deposited dopant source layer and form compound particle defects. In addition, the amount of the dopant diffused to the interface of high-k dielectric layer 309 and interfacial layer 307 may be higher than required such that a smaller dipole effect or $V_t$ shift (e.g., about 30 mV or less) may not be achieved. If the total thickness is greater than about 300 Å, the diffusion barrier layers may not further reduce the amount of the dopant diffused to the interface and the cost of the deposition process may increase. As shown in FIG. 13, the thickness of the interfacial layer doped with the dopant can decrease as the total thickness of the diffusion barrier layers increases. After the total thickness reaches about t1, the thickness of the interfacial layer doped with the dopant may not further decrease with the increase of the total thickness of the diffusion barrier layers.

The diffusion barrier layer can include tantalum nitride (TaN), aluminum nitride (AlN), tantalum titanium nitride ($Ta_xTi_yN_z$), titanium nitride ($TiN_x$), titanium aluminum nitride ($Ti_xAl_yN_z$), titanium silicon nitride ($Ti_xSi_yN_z$), or other suitable materials. In some embodiments, $Ta_xTi_yN_z$ can include Ta concentration ranging from about 8 atomic percent to about 35 atomic percent, Ti concentration ranging from about 8 atomic percent to about 35 atomic percent, and N concentration ranging from about 20 atomic percent to about 51 atomic percent. In some embodiments, for $Ta_xTi_yN_z$, X can range from about 0.8 to about 2, Y can range from about 0.8 to about 2, and Z can range from about 1.5 to about 4. In some embodiments, a ratio of a sum of X and Y to Z can range from about 0.8 to about 2. In some embodiments, a ratio of X to Y can range from about 0.8 to 1.5. In some embodiments, $TiN_x$ can include Ti concentration ranging from about 22 atomic percent to about 35 atomic percent and N concentration ranging from about 24 atomic percent to about 51 atomic percent. In some embodiments, for $TiN_x$, X can range from about 0.8 to about 1.5. In some embodiments, $Ti_xAl_yN_z$ can include Ti concentration ranging from about 8 atomic percent to about 35 atomic percent, Al concentration ranging from about 8 atomic percent to about 35 atomic percent, and N concentration ranging from about 20 atomic percent to about 51 atomic percent. In some embodiments, for $Ti_xAl_yN_z$, X can range from about 0.8 to about 2, Y can range from about 0.8 to about 2, and Z can range from about 0.8 to about 3. In some embodiments, a ratio of a sum of X and Y to Z can range from about 0.5 to about 2. In some embodiments, a ratio of X to Y can range from about 0.5 to 1.5. In some embodiments, $Ti_xSi_yN_z$ can include Ti concentration ranging from about 8 atomic percent to about 35 atomic percent, Si concentration ranging from about 8 atomic percent to about 35 atomic percent, and N concentration ranging from about 20 atomic percent to about 51 atomic percent. In some embodiments, for $Ti_xSi_yN_z$, X can range from about 0.8 to about 2, Y can range from about 0.8 to about 2, and Z can range from about 0.8 to about 3. In some embodiments, a ratio of a sum of X and Y to Z can range from about 0.5 to about 2. In some embodiments, a ratio of X to Y can range from about 0.5 to 1.5.

Figure 9:
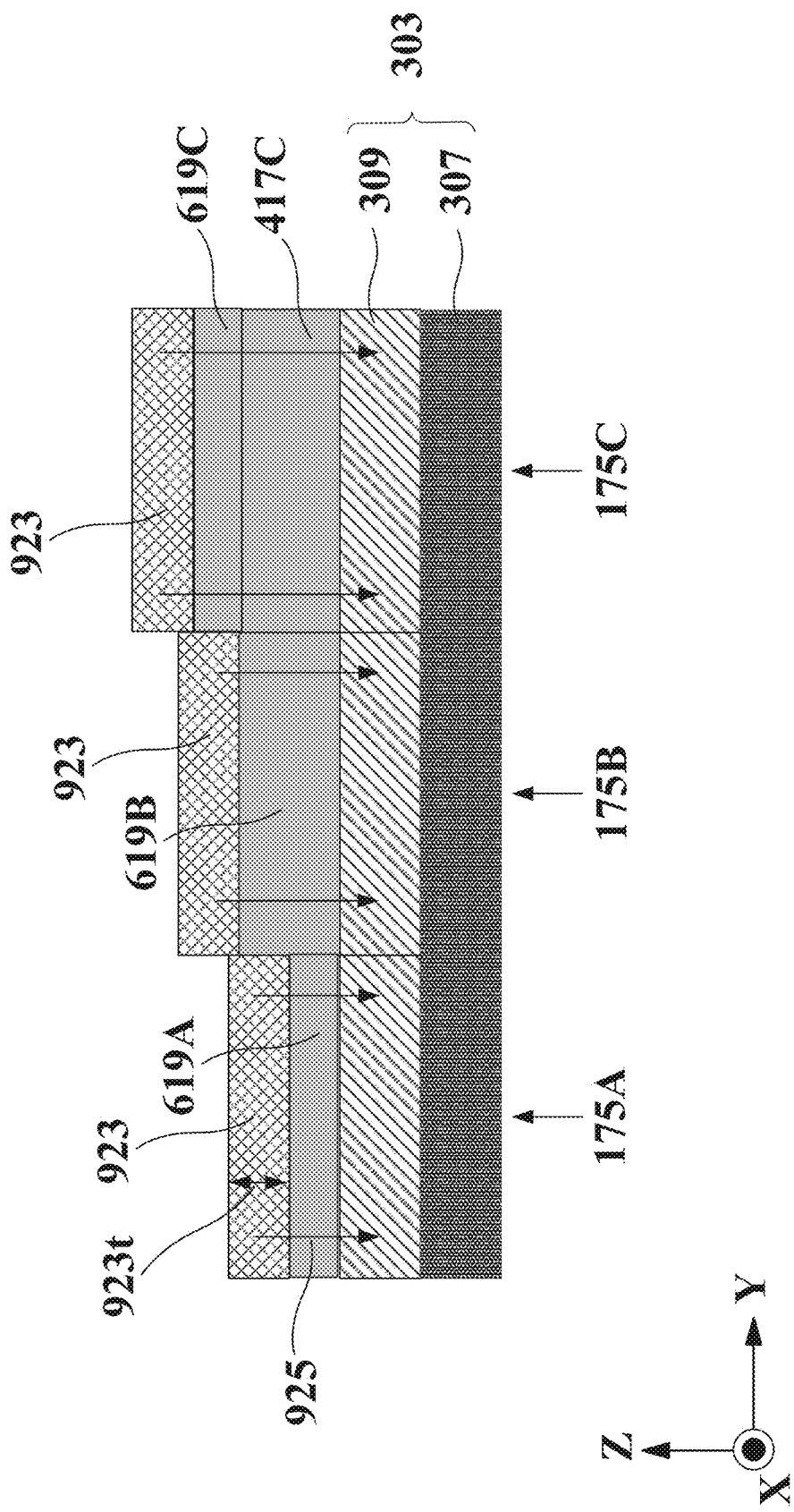

Referring to FIG. 2, method 200 continues with operation 230 and the process of forming a dopant source layer with a dopant on the diffusion barrier layer. As shown in FIG. 9, dopant source layer 923 can be deposited on diffusion barrier layers 619A, 619B, and 619C by ALD, CVD, PEALD, or other suitable deposition methods with a thickness 923t along a Z-axis from about 3 Å to about 300 Å. Dopant source layer 923 can provide the dopant to gate dielectric layer 303. If thickness 923t is less than about 3 Å, dopant source layer 923 may not be uniformly formed on the diffusion barrier layers across various devices on the wafer due to process concerns. If thickness 923t is greater than about 300 Å, dopant source layer 923 can mix with gate dielectric layer 303 and form compound particle defects, which may not be removed completely by the etching process, and the manufacturing cost may increase.

By way of example and not limitation, dopant source layer 923 can include aluminum oxide ($AlO_x$), magnesium oxide (MgO), lanthanum oxide ($La_2O_3$), lutetium oxide ($Lu_2O_3$), scandium oxide ($Sc_2O_3$), strontium oxide (SrO), zirconium oxide ($ZrO_2$), yttrium oxide ($Y_2O_3$), dysprosium oxide ($DyO_x$), europium oxide ($EuO_x$), erbium oxide ($ErO_x$), ytterbium oxide ($Yb_2O_3$), and other suitable rare earth metal oxides, alkaline earth metal oxide, and transition metal oxides. Dopant source layer 923 can be deposited by ALD, PEALD, CVD, or other suitable deposition methods at a temperature ranging from about 100° C. to about 600° C. with a pressure ranging from about 1 torr to about 600 torr. The deposition process can use suitable organometallic precursors of aluminum (Al), magnesium (Mg), lanthanum (La), lutetium (Lu), scandium (Sc), strontium (Sr), zirconium (Zr), yttrium (Y), dysprosium (Dy), europium (Eu), erbium (Er), ytterbium (Yb), or other rare earth metals, alkaline earth metals, and transition metals at a gas flow rate ranging from about 5 sccm to about 20000 sccm. The precursors can also include oxygen ($O_2$), ozone ($O_3$), or water vapor ($H_2O$) to form oxides. $H_2O$ may be used for non-rare earth elements, such as Al and Mg, and may not be used for rare earth elements, such as La, Sc, and Y, due to the hygroscopic nature of rare earth elements causing formation of hydroxides instead of oxides. Rare earth metal hydroxides can have a lower dielectric constant than rare earth metal oxides. The deposition process can include one or more cycles of precursor pulse and purge. The precursor pulse time in each cycle can range from about 0.05 s to about 120 s, and the purge time can range from about 0.2 s to about 250 s. The deposition rate per cycle can range from about 1 Å/cycle to about 150 Å/cycle.

Referring to FIG. 2, method 200 continues with operation 240 and the process of doping a portion of the interfacial layer adjacent to the high-k dielectric layer with the dopant. As shown in FIG. 9, the dopant in dopant source layer 923 can diffuse to the interface of high-k dielectric layer 309 and interfacial layer 307 under a thermal condition. A top portion of interfacial layer 307 adjacent to high-k dielectric layer 309 and a bottom portion of high-k dielectric layer 309 adjacent to interfacial layer 307 can be doped with the dopant. Arrows 925 can indicate a direction of the diffusion of the dopant. In some embodiments, the dopant can diffuse through the diffusion barrier layers to the interface by an isothermal anneal at an annealing temperature ranging from about 540° C. to about 800° C. The isothermal anneal can be performed in an inert gas environment, such as nitrogen and argon, at a pressure ranging from about 1 torr to about 780 torr for about 3 s to about 100 s.

After the doping process, the dopant can diffuse to the interface of high-k dielectric layer 309 and interfacial layer 307 and form dipoles in high-k dielectric layer 309 and interfacial layer 307. Depending upon the nature of the dopant used, the dipoles in high-k dielectric layer 309 and interfacial layer 307 can attract electrons (or holes) in the channel under gate dielectric layer 303 and thus decrease $V_t$ for the NFET (or decrease $V_t$ for PFET). The dipoles in gate dielectric layer 303 can also repel holes in the channel and thus increase $V_t$ for the PFET (or increase $V_t$ for NFET). The dipoles at interfacial layer 307 can cause more $V_t$ shift than the dipoles in the high-k dielectric layer due to a smaller distance between the interfacial layer and the channel and also due to less dipole charge shielding by the lower k interfacial layer material of interfacial layer 307 than by the higher k material of high-k dielectric layer 309. In addition, the doping of high-k dielectric layer 309 can amorphize the crystal structure of high-k dielectric layer 309 and thus decrease the leakage in high-k dielectric layer 309. Moreover, as the dopant dopes the interface of high-k dielectric layer 309 and interfacial layer 307 and the dopant is immobile; thus, the dopant at the interface may not diffuse into high-k dielectric layer 309 or interfacial layer 307 of adjacent FETs across metal boundaries 170. The $V_t$ of adjacent FETs can shift due to a diffusion of metals (e.g., aluminum) from the gate stack layers of one FET to the adjacent FET across the metal boundary, which is referred to as "metal boundary effect" (MBE). As a result of the dopant at the interface of high-k dielectric layer 309 and interfacial layer 307, doping the interface of high-k dielectric layer 309 and interfacial layer 307 can reduce MBE.

Figure 10:
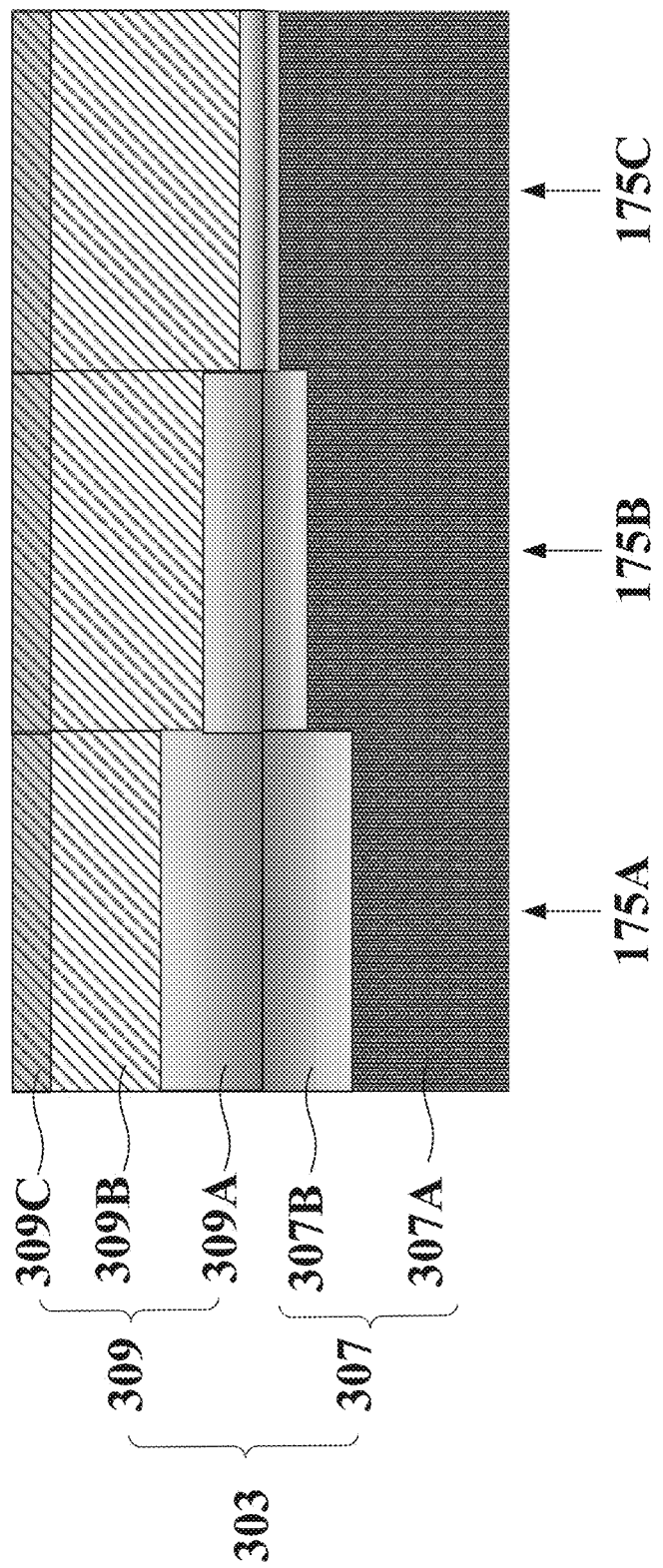

Referring to FIG. 2, method 200 continues with operation 250 and the process of removing the dopant source layer. As shown in FIG. 10, dopant source layer 923 and diffusion barrier layers 417C, 619A, 619B, and 619C can be removed from the top of high-k dielectric layer 309.

In some embodiments, a wet chemical etching process can remove dopant source layer 923 at a temperature range from about 25° C. to about 300° C. after the doping process. Depending upon the type of dopant source layer 923, the wet chemical etching process can use an etchant including a combination of one or more of diluted hydrochloric acid (dHCl), hydrogen peroxide ($H_2O_2$), ammonia solution ($NH_4OH$), diluted hydrofluoric acid (dHF), deionized (DI) water, carbonated DI water, phosphoric acid ($H_3PO_4$), and other suitable etchants. For example, if dopant source layer 923 includes aluminum oxide, the wet chemical etching process can use DI water and an etchant including $NH_4OH$ or $NH_4OH$, $H_2O_2$. If dopant source layer 923 includes lanthanum oxide, the wet chemical etching process can use an etchant including dHCl or an etchant including carbonated DI water. The etching rate of dopant source layer 923 can range from about 1 Å/min to about 1500 Å/min. In some embodiments, the diffusion barrier layers can protect high-k dielectric layer 309 during the removal of dopant source layer 923, thus avoiding non-uniform and/or excessive loss of high-k dielectric layer 309.

In some embodiments, a wet chemical etching process can remove the diffusion barrier layers at a temperature range from about 25° C. to about 300° C. after the removal of dopant source layer 923. The wet chemical etching process can use an etchant including $NH_4OH$ and $H_2O_2$, an etchant including HCl and $H_2O_2$, an etchant including $H_2O_2$ and $H_3PO_4$, an etchant including hydrogen fluoride (HF), $NH_4OH$, and $H_2O_2$, or other suitable etchants. The etching rate of the diffusion barrier layer can range from about 1 Å/min to about 1500 Å/min. In some embodiments, the wet chemical etching process can include multiple operations. For example, the wet chemical etching process can include a first operation having a higher etching rate of the diffusion barrier layers (e.g. using an etchant including HCl, $H_2O_2$, and DI water) and a second operation having a lower etching rate (e.g., using an etchant including and DI wafer) to reduce high-k dielectric layer loss or damage. In some embodiments, the diffusion barrier layers can have a higher etch selectivity than the dopant source layer with respect to the high-k dielectric layer. The etch selectivity between the diffusion barrier layers and the high-k dielectric layer can range from about 450 to about 1000. As a result, excessive and/or non-uniform high-k dielectric layer loss can be avoided and the diffusion barrier layers and the dopant source layer can be removed with higher etch selectivity and better process control compared with no diffusion barrier layer.

After the doping and removal processes, a top portion of high-k dielectric layer 309 can include an intermixing layer 309C of the high-k dielectric layer and the diffusion barrier layers as shown in FIG. 10. In some embodiments, intermixing layer 309C can prevent metal diffusion (e.g., Al) from subsequently deposited gate work-function layers to gate dielectric layer 303. Metal diffusion to gate dielectric layer 303 can degrade device reliability, increase device leakage, and shift the $V_t$ of the FET device. In some embodiments, intermixing layer 309C can increase the effective dielectric constant of gate dielectric layer 303. In some embodiments, intermixing layer 309C can consume oxygen from interfacial layer 307 and thus decrease the effective oxide thickness of gate dielectric layer 303.

In some embodiments, a top portion 307B of interfacial layer 307 adjacent to high-k dielectric layer 309 can be doped with the dopant from dopant source layer 923 (also referred to as "doped top portion 307B"). The dopant concentration in doped top portion 307B and the thickness of doped top portion 307B of interfacial layer 307 can depend on the number of or the total thickness of diffusion barrier layers on gate dielectric layer 303, the annealing temperature of the doping process in operation 240, and the dopant's intrinsic affinity for silicon (also referred to as "dopant's silicide formation tendency"). As shown in FIG. 10, doped top portion 307B of interfacial layer 307 at region 175A can be thicker than doped top portion 307B of interfacial layer 307 at region 175B, which can be thicker than the doped portion of interfacial layer 307 at region 175C. In some embodiments, a bottom portion 309A of high-k dielectric layer 309 adjacent to interfacial layer 307 can also be heavily doped with the dopant (also referred to as "doped bottom portion 309A") and can have a dopant concentration in a range from about 2 atomic percent to about 55 atomic percent. The thickness of doped bottom portion 309A of high-k dielectric layer 309 can also depend on the number of or the total thickness of diffusion barrier layers on gate dielectric layer 303 and the annealing temperature of the doping process in operation 240.

In some embodiments, diffusion barrier layers 619A, 619B, 619C, and 417C can remain or can be partially removed (e.g., removing about 50% to about 80% of the thickness of the diffusion barrier layers at each region) after the removal of dopant source layer 923 (not shown). In some embodiments, a nitridation treatment can be performed on the diffusion barrier layers and the treated diffusion barrier layers can act as p-type work function layers. As a result, the deposition of one or more p-type work function layers can be skipped in subsequent processes. In some embodiments, the nitridation treatment can include $NH_3$ soaking for about 10 s to about 360 s at a temperature ranging from about 400° C. to about 650° C. In some embodiments, the nitridation treatment can include a nitrogen plasma treatment of $N_2$ plasma, $N_2$ and $H_2$ plasma, or $NH_3$ plasma for about 5 s to about 100 s. In some embodiments, the nitridation treatment can include a nitrogen free-radical treatment for about 5 s to about 100 s using $N_2$ remote plasma and an ion filter to filter out free radicals from ions. The nitridation treatment can increase the effective work function of the diffusion barrier layers, which can act as work function tuning layers. The nitridation treatment can also increase nitrogen concentration in high-k dielectric layer 309, which can passivate oxygen vacancies in high-k dielectric layer 309 and thus reduce device leakage and improve device reliability.

In some embodiments, diffusion barrier layers 619A, 619B, 619C, and 417C can be formed on interfacial layer 307 before the deposition of high-k dielectric layer 309. Dopant source layer 923 can be deposited on the diffusion barrier layers. The dopant can be doped in interfacial layer 307 under a thermal condition. Dopant source layer 923 and the diffusion barrier layers can be removed after the doping process. The removal of dopant source layer 923 and the diffusion barrier layers can be followed by the deposition of high-k dielectric layer 309 and subsequent gate electrodes. As a result, the dopant can be doped in a top portion of interfacial layer 307 adjacent to high-k dielectric layer 309 but may not be doped in high-k dielectric layer 309. High-k dielectric layer 309 may not include an intermixing layer of high-k dielectric layer 309 and the diffusion barrier layers.

Figure 11:
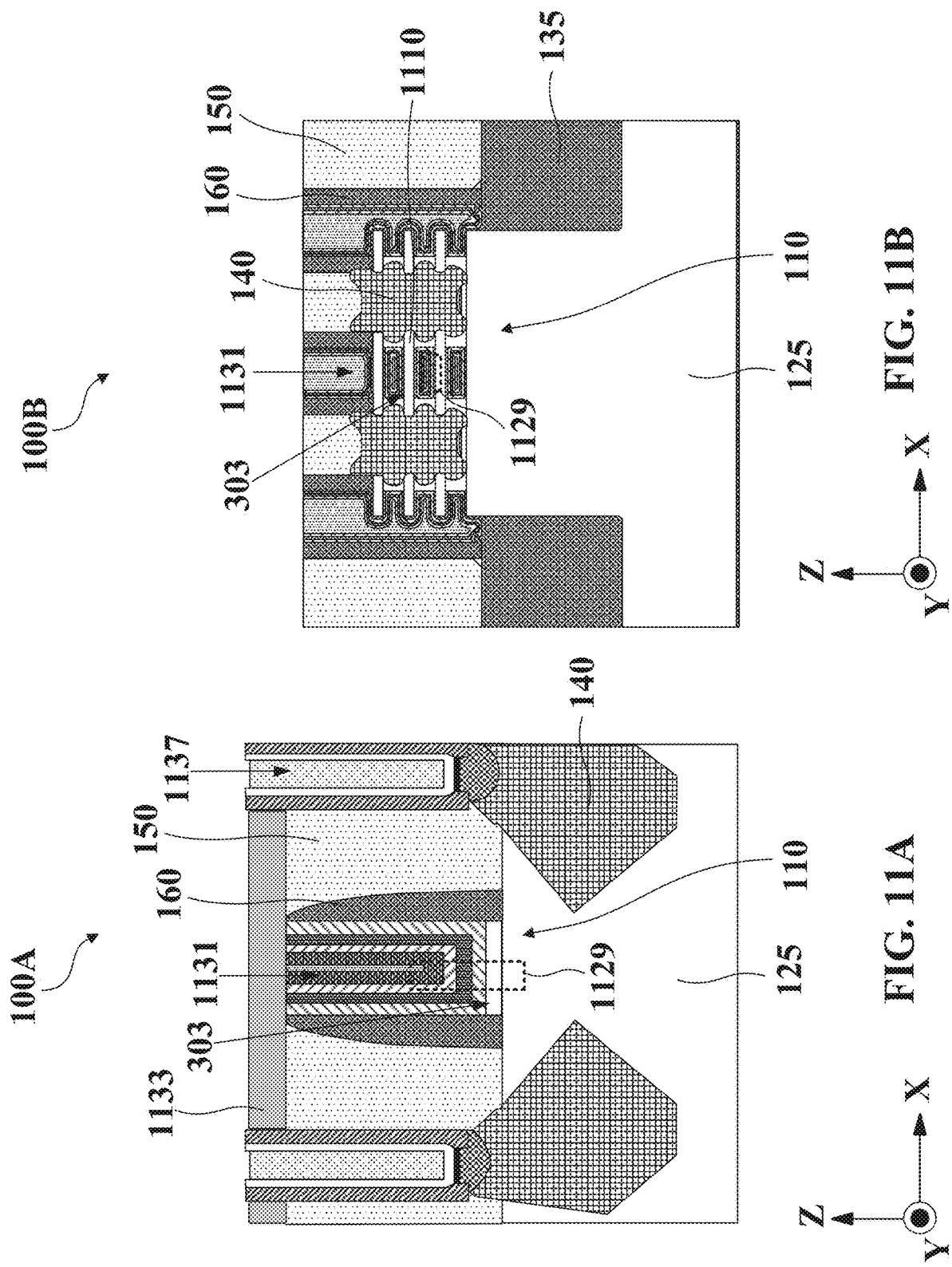
Figure 12:
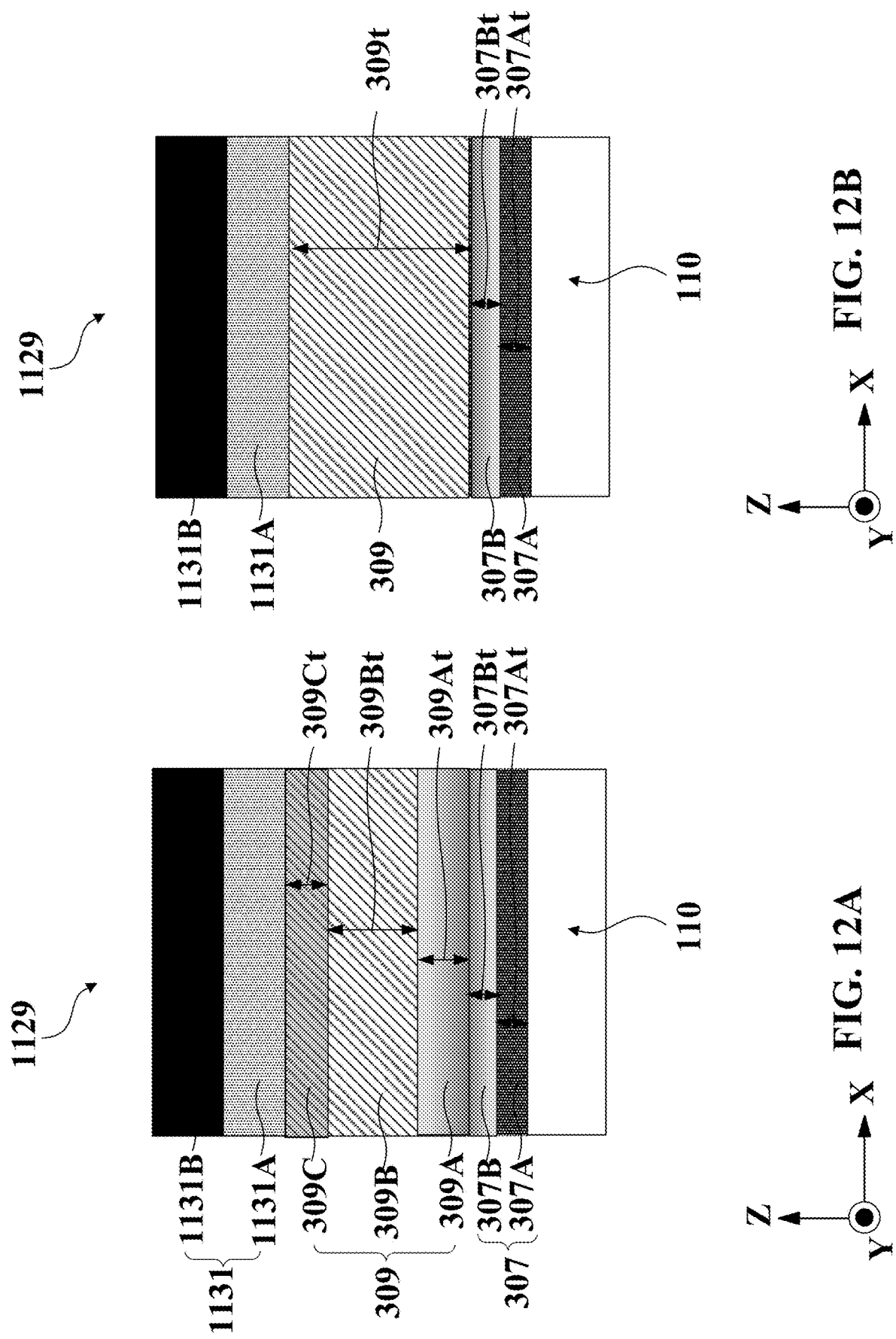

The removal of the dopant source layer and the diffusion barrier layers can be followed by the formation of gate electrodes, as shown in FIGS. 11A-12B. FIGS. 11A and 11B illustrate partial cross-sectional views along an X-axis of semiconductor devices 100A and 100B having gate dielectric layer 303 with controlled doping for finFETs and GAA FETs respectively. FIG. 12A illustrates a cross-sectional view of an enlarged region 1129 of semiconductor devices 100A and 100B having doped interfacial layer and doped high-k dielectric layer. FIG. 12 B illustrates a cross-section view of an enlarged region 1129 of semiconductor devices 100A and 100B having doped interfacial layer. In some embodiments, after the removal of the dopant source layer and the diffusion barrier layers, another high-k dielectric layer can be deposited on high-k dielectric layer 309 with subsequent annealing before the formation of gate electrodes (not shown).

As shown in FIG. 11A of semiconductor device 100A for finFETs, gate electrodes 1131 can be formed on gate dielectric layer 303 over fin structures 110. Gate electrodes 1131 can be protected by capping structure 1133 for the formation of S/D contacts 1137 on S/D epitaxial fin structures 140. Enlarged region 1129 is illustrated in FIGS. 12A and 12B in more details. As shown in FIG. 12B of semiconductor device 100B for GAA FETs, gate dielectric layer 303 and gate electrodes 1131 can be formed on fin structures 110 and wrapped around semiconductor layers 1110. Enlarged region 1129 is also illustrated in FIGS. 12A and 12B in more details.

In some embodiments, gate electrodes 1131 in FIGS. 11A and 11B can include a work function stack, a glue layer, and a metal fill. The work function stack can include one or more work function layers. Gate electrodes 1131 can include conductive materials, such as titanium (Ti), tantalum (Ta), titanium nitride (TiN), tantalum nitride (TaN), aluminum (Al), copper (Cu), tungsten (W), cobalt (Co), titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), nickel (Ni), titanium carbide (TiC), titanium aluminum carbide (TiAlC), tantalum aluminum carbide (TaAlC), and other suitable conductive materials.

As shown in FIGS. 12A and 12B, region 1129 can include fin structures 110, interfacial layer 307, high-k dielectric layer 309, work function layer 1131A, and metal fill 1131B. FIG. 12A illustrates enlarged region 1129 with gate dielectric layer 303 having controlled doping by depositing dopant source layer 923 on high-k dielectric layer 309, according to some embodiments. As shown in FIG. 12A, interfacial layer 307 can include a top portion 307B doped with the dopant and high-k dielectric layer 309 can include a bottom portion 309A doped with the dopant. In addition, high-k dielectric layer 309 can include an intermixing layer 309C intermixed of high-k dielectric layer 309 and the diffusion barrier layers. FIG. 12B illustrates enlarged region 1129 with gate dielectric layer 303 having controlled doping by depositing dopant source layer 923 on interfacial layer 307, according to some embodiments. As shown in FIG. 12B, interfacial layer 307 can include a top portion 307B doped with the dopant. High-k dielectric layer 309 may not include portions doped with the dopant and may not include an intermixing layer.

As shown in FIGS. 12A and 12B, interfacial layer 307 can include an undoped bottom portion 307A and a doped top portion 307B doped with the dopant from dopant source layer 923 (shown in FIG. 9). In some embodiments, as shown in FIG. 12A, undoped bottom portion 307A of interfacial layer 307 can have a thickness 307At ranging from about 5 Å to about 30 Å. Doped top portion 307B of interfacial layer 307 can have a thickness 307Bt ranging from about 1 Å to about 10 Å. A ratio of thickness 307At to a sum of thicknesses 307At and 307Bt can range from about 0.03 to about 0.6. In some embodiments, as shown in FIG. 12B, undoped bottom portion 307A of interfacial layer 307 can have a thickness 307At ranging from about 5 Å to about 30 Å. Doped top portion 307B of interfacial layer 307 can have a thickness 307Bt ranging from about 1 Å to about 15 Å. A ratio of thickness 307At to a sum of thicknesses 307At and 307Bt can range from about 0.03 to about 0.8. If thickness 307Bt is less than about 1 Å, or the ratio is less than about 0.03, the dopant in doped top portion 307B of interfacial layer 307 may not effectively shift the $V_t$ of the FET device. If thickness 307Bt is greater than about 10 Å in FIG. 12A or greater than about 15 Å in FIG. 12B, or the ratio is greater than about 0.6 in FIG. 12A or greater than about 0.8 in FIG. 12B, the dopant in doped top portion 307B of interfacial layer 307 may result in larger $V_t$ shift of the FET device than the required $V_t$ shift (e.g., about 30 mV or less).

As shown in FIG. 12A, high-k dielectric layer 309 can include a heavily doped bottom portion 309A, an undoped or lightly doped middle portion 309B, and an intermixing layer 309C. In some embodiments, the heavily doped bottom portion 309A can have a dopant in a range from about 2 atomic percent to about 55 atomic percent. In some embodiments, the undoped or lightly doped middle portion 309B can have a dopant concentration in a range from about 0 atomic percent to about 40 atomic percent. In some embodiments, doped bottom portion 309A of high-k dielectric layer 309 can have a thickness 309At ranging from about 3 Å to about 20 Å, undoped or lightly doped middle portion 309B of high-k dielectric layer 309 can have a thickness 309Bt ranging from about 5 Å to about 40 Å, and intermixing layer 309C can have a thickness 309Ct ranging from about 3 Å to about 15 Å. A first ratio of thickness 309At to a sum of thicknesses 309At, 309Bt, and 309Ct can range from about 0.03 to about 0.4. If thickness 309At is less than about 3 Å, or the first ratio is less than about 0.03, the dopant in doped portion 309A of high-k dielectric layer 309 may not effectively shift the $V_t$ of the FET device. If thickness 309At is greater than about 20 Å, or the first ratio is greater than about 0.4, the dopant in doped bottom portion 309A of high-k dielectric layer 309 may result in larger $V_t$ shift of the FET device than the required $V_t$ shift (e.g., about 30 mV or less) or cause flicker noise issue. In some embodiments, a second ratio of thickness 309Ct to a sum of thicknesses 309At, 309Bt, and 309Ct can range from about 0.03 to about 0.3.

Various embodiments in the present disclosure provide methods for forming semiconductor device 100 having gate dielectric layer 303 with controlled doping. In some embodiments, gate dielectric layer 303 can be formed on fin structures 110. Gate dielectric layer 303 can include interfacial layer 307 on fin structures 110 and high-k dielectric layer 309 on interfacial layer 307. In some embodiments, diffusion barrier layers 619A, 619B, 619C, and 417C can be formed on gate dielectric layer 303. Dopant source layer 923 can be formed on diffusion barrier layers 619A, 619B, and 619C to dope a portion of high-k dielectric layer 309 and interfacial layer 307 with the dopant and form dopant dipoles at the interface of high-k dielectric layer 309 and interfacial layer 307.

Diffusion barrier layers 619A, 619B, 619C, and 417C can prevent mixing of dopant source layer 923 and high-k dielectric layer 309, thus reducing compound particle defects. A uniform dopant profile across fin and gate structures can be achieved with the diffusion barrier layer. With the dopant diffused from dopant source layer 923 through diffusion barrier layers 619A, 619B, 619C, and 417C to the interface of high-k dielectric layer 309 and interfacial layer 307, lower dopant concentration (e.g., less than about $5 \times 10^{13}$ atoms/cm$^2$) and smaller dopant dipole at the interface can be achieved for a smaller $V_t$ shift (e.g., about 30 mV or less), uniformly throughout the wafer. Doped top portion 307B of interfacial layer 307 can have a higher dielectric constant (k value) and thus reduce the effective oxide thickness (EOT) of interfacial layer 307. Dopant source layer 923 may not require a patterning process or a wet clean process before the doping operation, thereby avoiding the formation of hydroxides having lower k value. In addition, dopant source layer 923 can have no or less exposure to moisture and the wet chemicals during the doping process. In some embodiments, the diffusion barrier layer can be removed completely or partially before depositing a gate electrode. In some embodiments, a nitridation treatment is performed on the diffusion barrier layer and the diffusion barrier can be a part of the gate electrode. In some embodiments, a thickness of the doped portion of the interfacial layer can depend on a total thickness of the diffusion barrier layers on the FET device. In some embodiments, intermixing layer 309C of high-k dielectric layer 309 and the diffusion barrier layers can be formed at the interface of these two layers. Intermixing layer 309C can prevent metal (e.g., aluminum) diffusion from gate electrodes 1131 to high-k dielectric layer 309 and improve control of $V_t$ shifts due to the metal diffusion, device leakage, and device reliability performance. In some embodiments, the diffusion barrier layers and dopant source layer 923 can be formed on interfacial layer 307. After doping top portion 307B of interfacial layer 307 with the dopant, dopant source layer 923 and the diffusion barrier layers can be removed. High-k dielectric layer 309 and the gate electrodes 1131 can be formed on the doped interfacial layer.

In some embodiments, a method includes forming a gate dielectric layer on a fin structure, forming a diffusion barrier layer on the gate dielectric layer, and forming a dopant source layer on the diffusion barrier layer. The gate dielectric layer includes an interfacial layer on the fin structure and a high-k dielectric layer on the interfacial layer. A dopant of the dopant source layer diffuses into the gate dielectric layer. The method further includes doping a portion of the interfacial layer with the dopant and removing the dopant source layer. The portion of the interfacial layer is adjacent to the high-k dielectric layer.

In some embodiments, a method includes forming a first gate dielectric layer on a first fin structure and a second gate dielectric layer on a second fin structure, forming a first diffusion barrier layer on the first gate dielectric layer and a second diffusion barrier layer on the second gate dielectric layer, and forming a dopant source layer on the first and second diffusion barrier layers. The first gate dielectric layer includes a first interfacial layer on the first fin structure and a first high-k dielectric layer on the first interfacial layer. The second gate dielectric layer includes a second interfacial layer on the second fin structure and a second high-k dielectric layer on the second interfacial layer. A thickness of the first diffusion barrier layer is different from that of the second diffusion barrier layer. A dopant of the dopant source layer diffuses into the first and second gate dielectric layers. The method further includes doping a portion of the first interfacial layer and a portion of the second interfacial layer with the dopant and removing the dopant source layer. The portion of the first interfacial layer is adjacent to the first high-k dielectric layer and the portion of the second interfacial layer is adjacent to the second high-k dielectric layer.

In some embodiments, a semiconductor device includes a fin structure on a substrate, an interfacial layer on the fin structure, and a high-k dielectric layer on the top portion of the interfacial layer. A top portion of the interfacial layer includes a dopant and the high-k dielectric layer includes a dielectric material. The semiconductor device further includes an intermixing layer on the high-k dielectric layer. The intermixing layer includes the dielectric material, nitrogen, and at least one of titanium, tantalum, and aluminum.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate dielectric layer on a fin structure, wherein the gate dielectric layer comprises an interfacial layer on the fin structure and a high-k dielectric layer on the interfacial layer;
    forming a diffusion barrier layer comprising a nitride material on the gate dielectric layer;
    forming a dopant source layer comprising a metal oxide on the diffusion barrier layer, wherein a metal of the dopant source layer diffuses into the gate dielectric layer;
    diffusing the metal through the diffusion barrier layer to a portion of the interfacial layer, wherein the portion of the interfacial layer is adjacent to the high-k dielectric layer; and
    removing the dopant source layer.

2. The method of claim 1, further comprising:
    removing the diffusion barrier layer; and
    forming a gate electrode on the gate dielectric layer.

3. The method of claim 1, further comprising:
    performing a nitridation treatment on the diffusion barrier layer; and
    forming a gate electrode on the gate dielectric layer.

4. The method of claim 1, wherein the diffusing the metal through the diffusion barrier layer to the portion of the interfacial layer comprises treating the dopant source layer under a thermal condition.

5. The method of claim 1, further comprising forming an intermixing layer in a portion of the high-k dielectric layer adjacent to the diffusion barrier layer, wherein the intermixing layer is an intermixture of the high-k dielectric layer and the diffusion barrier layer.

6. The method of claim 1, further comprising doping a portion of the high-k dielectric layer with the metal, wherein the portion of the high-k dielectric layer is adjacent to the interfacial layer.

7. The method of claim 6, wherein the doping of the portion of the high-k dielectric layer comprises treating the dopant source layer under a thermal condition.

8. The method of claim 1, the forming the diffusion barrier layer comprises:
    depositing a layer of diffusion barrier material on the gate dielectric layer; and
    etching a top portion of the layer of diffusion barrier material on the gate dielectric layer.

9. The method of claim 1, the forming the diffusion barrier layer comprises:
    depositing a first layer of diffusion barrier material on the gate dielectric layer;
    depositing a second layer of diffusion barrier material in contact with the first layer of diffusion barrier material; and
    etching a top portion of the second layer of diffusion barrier material on the gate dielectric layer.

10. A method, comprising:
    forming a first gate dielectric layer on a first fin structure and a second gate dielectric layer on a second fin structure, wherein the first gate dielectric layer comprises a first interfacial layer on the first fin structure and a first high-k dielectric layer on the first interfacial layer, and wherein the second gate dielectric layer comprises a second interfacial layer on the second fin structure and a second high-k dielectric layer on the second interfacial layer;

forming a first diffusion barrier layer on the first and second gate dielectric layers;

removing the first diffusion barrier layer on the first gate dielectric layer;

forming a second diffusion barrier layer on the first gate dielectric layer and the first diffusion barrier layer;

forming a dopant source layer on the first and second diffusion barrier layers, wherein a dopant of the dopant source layer diffuses into the first and second gate dielectric layers;

doping a portion of the first interfacial layer and a portion of the second interfacial layer with the dopant, wherein:
the portion of the first interfacial layer is adjacent to the first high-k dielectric layer, and
the portion of the second interfacial layer is adjacent to the second high-k dielectric layer; and removing the dopant source layer.

11. The method of claim 10, further comprising:
removing the first and second diffusion barrier layers; and
forming first and second gate electrodes on the first and second gate dielectric layers, respectively.

12. The method of claim 10, further comprising:
performing a nitridation treatment on the first and second diffusion barrier layers; and
forming first and second gate electrodes on the first and second gate dielectric layers, respectively.

13. The method of claim 10, wherein the doping the portion of the first interfacial layer and the portion of the second interfacial layer comprises treating the dopant source layer under a thermal condition to diffuse the dopant to the portion of the first interfacial layer and the portion of the second interfacial layer.

14. The method of claim 10, wherein the doped portion of the first interfacial layer comprises a thickness different from that of the doped portion of the second interfacial layer.

15. The method of claim 10, further comprising forming an intermixing layer in the first high-k dielectric layer adjacent to the first diffusion barrier layer and a second intermixing layer in the second high-k dielectric layer adjacent to the second diffusion barrier layer.

16. The method of claim 10, further comprising doping a portion of the first high-k dielectric layer and a portion of the second high-k dielectric layer, wherein the portion of the first high-k dielectric layer is adjacent to the first interfacial layer and the portion of the second high-k dielectric layer is adjacent to the second interfacial layer.

17. A method, comprising:
forming a gate dielectric layer on first and second fin structures, wherein the gate dielectric layer comprises an interfacial layer and a high-k dielectric layer;
forming a first diffusion barrier layer on the gate dielectric layer over the first fin structure;
forming a second diffusion barrier layer in contact with the first diffusion barrier layer over the first fin structure and in contact with the gate dielectric layer over the second fin structure;
forming a dopant source layer on the first and second diffusion barrier layers, wherein the dopant source layer comprises a dopant;
doping a portion of the interfacial layer with the dopant, wherein the doped portion of the interfacial layer is adjacent to the high-k dielectric layer; and
removing the dopant source layer.

18. The method of claim 17, further comprising:
removing the first and second diffusion barrier layers; and
forming first and second gate electrodes on the gate dielectric layer.

19. The method of claim 17, further comprising:
removing a top portion of the first diffusion barrier layer over the first fin structure prior to forming the dopant source layer.

20. The method of claim 17, wherein the doping the portion of the interfacial layer comprises treating the dopant source layer under a thermal condition to diffuse the dopant to the portion of the interfacial layer.

* * * * *